(12) United States Patent
Narayanan et al.

(10) Patent No.: US 12,075,712 B2
(45) Date of Patent: Aug. 27, 2024

(54) RESISTIVE SWITCHING MEMORY DEVICES AND METHOD(S) FOR FORMING THE RESISTIVE SWITCHING MEMORY DEVICES

(71) Applicant: CROSSBAR, INC., Santa Clara, CA (US)

(72) Inventors: Sundar Narayanan, Cupertino, CA (US); Wee Chen Gan, Cupertino, CA (US); Natividad Vasquez, Jr., San Francisco, CA (US)

(73) Assignee: CROSSBAR, INC., Santa Clara, CA (US)

( * ) Notice: Subject to any disclaimer, the term of this patent is extended or adjusted under 35 U.S.C. 154(b) by 678 days.

(21) Appl. No.: 17/218,624

(22) Filed: Mar. 31, 2021

(65) Prior Publication Data

US 2022/0320429 A1  Oct. 6, 2022

(51) Int. Cl.
*H01L 45/00* (2006.01)
*H10B 63/00* (2023.01)
*H10N 70/00* (2023.01)

(52) U.S. Cl.
CPC .......... *H10N 70/021* (2023.02); *H10B 63/80* (2023.02); *H10N 70/041* (2023.02); *H10N 70/063* (2023.02); *H10N 70/066* (2023.02); *H10N 70/841* (2023.02); *H10N 70/8833* (2023.02)

(58) Field of Classification Search
CPC ... H10N 70/021; H10N 70/041; H10N 70/066
See application file for complete search history.

(56) References Cited

U.S. PATENT DOCUMENTS

| | | | |
|---|---|---|---|
| 9,595,670 | B1 | 3/2017 | Gee et al. |
| 10,608,180 | B2 | 3/2020 | Jo et al. |
| 10,840,442 | B2 | 11/2020 | Jo |
| 2016/0343937 | A1 | 11/2016 | Jo |
| 2022/0320429 | A1* | 10/2022 | Narayanan ........... H10N 70/245 |

OTHER PUBLICATIONS

Office Action for corresponding Chinese Patent Application No. 202111526137.7, dated Apr. 19, 2024, 19 pages long.

* cited by examiner

*Primary Examiner* — Mark V Prenty
(74) *Attorney, Agent, or Firm* — Wegman Hessler Valore

(57) ABSTRACT

Fabrication of resistive switching memory devices is herein provided. By way of example, a method for a two-step etch for fabricating a non-volatile resistive memory device is disclosed. In another example, a method for a three-step etch for fabricating a non-volatile resistive memory device is provided. Still other embodiments disclose a method for fabricating a non-volatile metal nitrogen/metal oxygen resistive switching memory device. Further embodiments disclose a method for fabricating a volatile resistive switching selector device. Processes for forming protective spacers in conjunction with fabricating a disclosed resistive memory device are also provided.

20 Claims, 27 Drawing Sheets

RESISTIVE MEMORY DEPOSITION
100

FIRST ETCH: HARD MASK PLASMA ETCH
200

FIRST ETCH: HARD MASK PLASMA ETCH
700

PR STRIP/POST ETCH CLEAN
800

FIRST ETCH: HARD MASK PLASMA ETCH
1400

RESISTIVE SWITCHING MEMORY DEVICES AND METHOD(S) FOR FORMING THE RESISTIVE SWITCHING MEMORY DEVICES

INCORPORATION BY REFERENCE

U.S. Pat. No. 9,425,237 filed Dec. 31, 2014 and entitled "SELECTOR DEVICE FOR TWO-TERMINAL MEMORY", U.S. Pat. No. 9,685,483 filed Mar. 10, 2016 and entitled "SELECTOR-BASED NON-VOLATILE CELL FABRICATION UTILIZING IC-FOUNDRY COMPATIBLE PROCESS", U.S. Pat. No. 9,595,670 filed Jul. 21, 2014 and entitled "RESISTIVE RANDOM ACCESS MEMORY (RRAM) CELL AND METHOD FOR FORMING THE RRAM CELL", U.S. Pat. No. 9,768,234 filed Mar. 9, 2015 and entitled "RESISTIVE MEMORY ARCHITECTURE AND DEVICES", and U.S. Pat. No. 10,749,110 filed Apr. 13, 2017 and entitled "MEMORY STACK LINER COMPRISING DIELECTRIC BLOCK LAYER MATERIAL", are each hereby incorporated by reference herein in their respective entireties and for all purposes.

TECHNICAL FIELD

Embodiments of the present disclosure pertain to electronic memory structures; for example, various embodiments disclose apparatuses and methods for fabricating resistive switching memory structures.

BACKGROUND

The inventors are cognizant of a variety of solid state memory structures utilized for modern electronic memory and computing devices. Tight control over the processes utilized to fabricate modern solid state memory structures is important to create properly operating memory structures, as well as achieve close uniformity among multiple devices.

In various embodiments, the inventors of the present disclosure desire to minimize the impact of variations in semiconductor fabrication processes. Process variations can differ among multiple semiconductor wafers produced by a process, or among dies within a single wafer(s) or both. In turn these process variations can lead to variations in performance of memory structures on a given die. Performance variations outside of acceptable fabrication ranges are generally considered bad parts, and discarded. This reduction in acceptable yield of parts increases overhead cost of the process as a whole. While some performance variations are small enough to remain within target operating specifications, they can still have detrimental impact on memory performance over time.

In light of the above, the inventors have desired new mechanisms for processing semiconductor wafers, and particularly processing resistive memory structures within one or more semiconductor wafers, that overcome current challenges in the art encountered by the inventors.

SUMMARY

The following presents a simplified summary of the subject disclosure in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

In various embodiments disclosed herein, there is provided methods for fabricating resistive switching memory devices. In an embodiment, there is disclosed a method for a two-step etch for fabricating a non-volatile resistive memory device. In another embodiment, there is disclosed a method for a three-step etch for fabricating a non-volatile resistive memory device. Still other embodiments disclose a method for fabricating a non-volatile metal nitrogen/metal oxygen resistive switching memory device. Further embodiments disclose one or more processes for fabricating one or more protective spacers in conjunction with fabricating a disclosed resistive memory device. Further embodiments disclose an example nitrogen profile concentration for a non-stoichiometric metal nitrogen layer (e.g., a nitrogen-rich metal or a nitrogen-poor metal) of a resistive memory device, in an embodiment(s). Further embodiments disclose a method for fabricating a volatile resistive switching selector device.

In an embodiment, disclosed is a method for fabricating a two-terminal resistive switching memory device. The method can comprise depositing a metal layer overlying and in contact with a bottom electrode and with a dielectric material. In various embodiments, the bottom electrode can be formed within a void fabricated within the dielectric material with a damascene process, and the bottom electrode and the dielectric material overlie a substrate. The method can further comprise depositing a switching matrix overlying the metal layer, wherein the switching matrix is formed of an electrically resistive material having material defect sites configured to trap conductive particles. In addition the method can comprise depositing a donor material layer overlying the switching matrix comprising metal material including aluminum (Al), titanium (Ti) or tungsten (W) metal material, the donor material layer selected to provide conductive particles to the switching matrix in response to an electrical stimulus, the conductive particles including Al, Ti, or W metal particles. In some embodiments, the method can optionally comprise depositing an optional barrier material layer overlying the donor material layer. In further embodiments, the method can comprise depositing an electrically conductive barrier material overlying the barrier material layer, depositing a dielectric hard mask overlying the electrically conductive first barrier material and patterning a photoresist material overlying the dielectric hard mask. In still further embodiments, the method can comprise etching the dielectric hard mask with a first etch and stopping the first etch on the electrically conductive first barrier material, the first etch comprising a plasma etch consisting of an etching gas selected from a first group consisting of: octafluorocyclobutane ($C_4F_8$), hexafluoro-2-butyne ($C_4F_6$), fluoroform ($CHF_3$), carbon tetrafluoride ($CF_4$), carbon monoxide (CO), oxygen ($O_2$), dinitrogen ($N_2$) and argon (Ar). In other embodiments, the method can comprise etching the electrically conductive barrier material, the optional barrier material layer, the donor material layer, the switching matrix and the metal layer with a second etch and stopping the second etch on the dielectric material, the second etch comprising a plasma etch consisting of an etching gas selected from a second group consisting of: chlorine ($Cl_2$), boron trichloride ($BCl_3$), hydrogen bromide (HBr), Ar, $N_2$, helium (He), $O_2$, $CHF_3$, $CF_4$, and sulfur hexafluoride ($SF_6$).

In further embodiments, disclosed is a method for fabricating a two-terminal resistive switching device. The method can comprise depositing a metal layer overlying and in contact with a bottom electrode and with a dielectric material, and wherein the bottom electrode and the dielectric material overlie a substrate, depositing an electrically conductive select donor layer overlying the metal layer and depositing a selector layer formed of an electrically resistive material having material defect sites configured to permit diffusion of conductive particles of the select donor layer within the selector layer in response to a first polarity bias applied to the two-terminal resistive switching device. Moreover, the method can comprise depositing a second electrically conductive select donor layer overlying the selector layer that supplies second conductive particles to the selector layer in response to a second polarity bias applied to the two-terminal resistive switching device, depositing an electrically conductive buffer material overlying the second electrically conductive select donor layer, depositing a dielectric hard mask overlying the electrically conductive first barrier material and patterning a photoresist material overlying the dielectric hard mask. Moreover, the method can comprise etching the dielectric hard mask with a first etch and stopping the first etch on the electrically conductive buffer material, the first etch comprising an etching gas including at least one of: $C_4F_8$, $C_4F_6$, $CHF_3$, $CF_4$, CO, $O_2$, $N_2$ or Ar. In a further embodiment, the method can comprise etching with a second etch a majority of the electrically conductive barrier material with a second etch and stopping the second etch without exposing the second electrically conductive select donor layer by the second etch, the second etch comprising an etching gas including one or more of: $Cl_2$, $BCl_3$, HBr, Ar, $N_2$, He, $O_2$, $CHF_3$, $CF_4$, and $SF_6$. In yet another embodiment, the method can comprise etching with a third etch comprising a physical etch a remaining minority of the electrically conductive barrier material, the second electrically conductive select donor layer, the selector layer and the electrically conductive select donor layer.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Introduction

Figure 1:
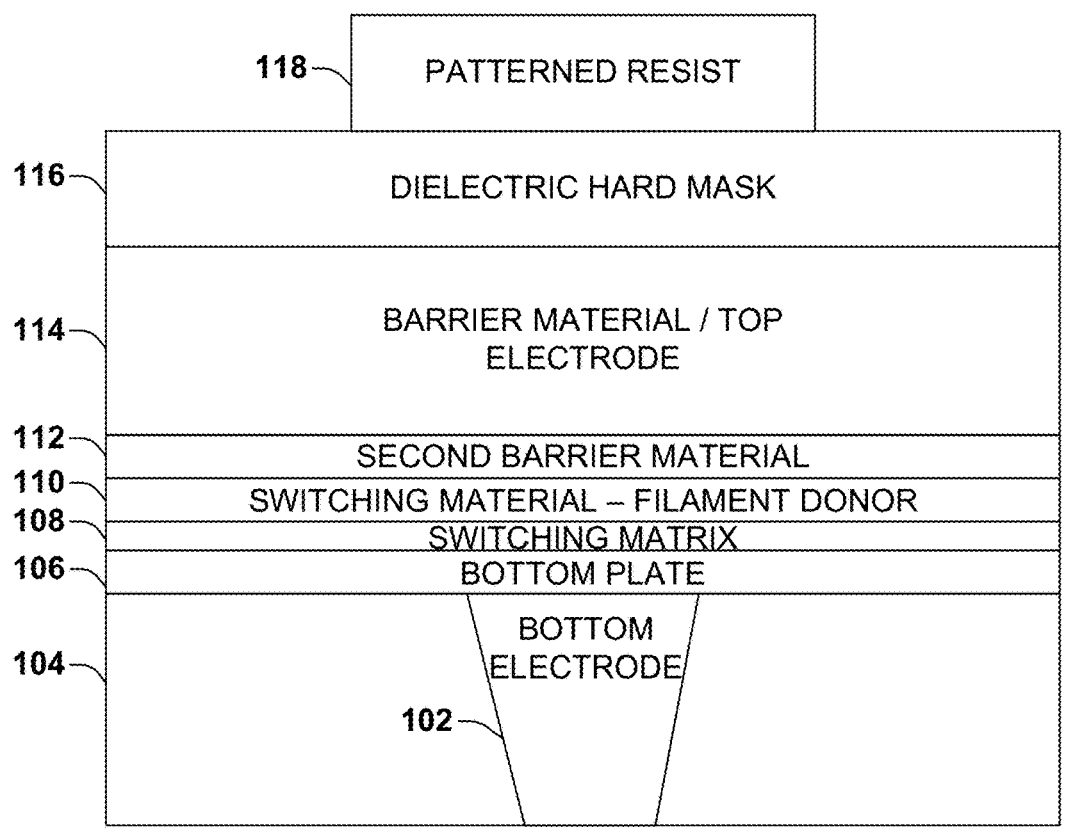
FIG. 1 illustrates a diagram of an example deposition for a resistive switching memory according to embodiments of the present disclosure.

As the name implies, a two-terminal resistive switching device has two terminals or electrodes. Herein, the terms "electrode" and "terminal" are used interchangeably; moreover, a two-terminal resistive switching device includes a non-volatile two-terminal memory device as well as a volatile two-terminal switching device. Generally, a first electrode of a two-terminal resistive switching device is referred to as a "top electrode" (TE) and a second electrode of the two-terminal resistive switching device is referred to as a "bottom electrode" (BE), although it is understood that electrodes of two-terminal resistive switching devices can be according to any suitable arrangement, including a horizontal arrangement in which components of a memory cell are (substantially) side-by-side rather than overlying one another. Situated between the TE and BE of a two-terminal resistive switching device is typically an interface layer sometimes referred to as a switching layer, a resistive switching medium (RSM) or a resistive switching layer (RSL); such devices are not limited to these layers, however, as one or more barrier layer(s), adhesion layer(s), ion conduction layer(s), seed layer(s) or the like, as disclosed herein, disclosed within any publication incorporated by reference herein, or as generally understood and utilized in the art, may be included between or adjacent one or more of the TE, the BE or the interface layer consistent with suitable operation of such device.

Composition of memory cells, generally speaking, can vary per device with different components selected to achieve desired characteristics (e.g., volatility/non-volatility, on/off current ratio, switching time, read time, memory durability, program/erase cycle, and so on). One example of a filamentary-based device can comprise: a conductive layer, e.g., metal, metal-alloy, metal-nitride, (e.g., comprising TiN, TaN, TiW, or other suitable metal compounds), an optional interface layer (e.g., doped p-type (or n-type) silicon (Si) bearing layer (e.g., a p-type or n-type Si bearing layer, p-type or n-type polysilicon, p-type or n-type polycrystalline SiGe, etc.)), a resistive switching layer (RSL) and an active metal-containing layer capable of being ionized. Under suitable conditions, the active metal-containing layer can provide filament-forming ions to the RSL. In such embodiments, a conductive filament (e.g., formed by the ions) can facilitate electrical conductivity through at least a subset of the RSL, and a resistance of the filament-based device can be determined, as one example, by a tunneling resistance between the filament and the conductive layer. A memory cell having such characteristics may be described as a filamentary-based device.

A RSL (which can also be referred to in the art as a resistive switching media (RSM)) can comprise, e.g., an undoped amorphous Si-containing layer, a semiconductor layer having intrinsic characteristics, a stoichiometric or non-stoichiometric silicon nitride (e.g., SiN, $Si_3N_4$, $SiN_x$, etc.), a Si sub-oxide (e.g., $SiO_x$ wherein x has a value between 0.1 and 2), a Si sub-nitride, a metal oxide, a metal nitride, a non-stoichiometric silicon compound, and so forth. Other examples of materials suitable for the RSL could include $Si_xGe_yO_z$ (where x, y and z are respective suitable positive numbers), a silicon oxide (e.g., SiON, where N is a suitable positive number), a silicon oxynitride, an undoped amorphous Si (a-Si), amorphous SiGe (a-SiGe), $TaO_B$ (where B is a suitable positive number), $HfO_C$ (where C is a suitable positive number), $TiO_D$ (where D is a suitable number), AWE (where E is a suitable positive number) and so forth, a nitride (e.g., AN, SiN), or a suitable combination thereof.

In some embodiments, a RSL employed as part of a non-volatile memory device (non-volatile RSL) can include a relatively large number (e.g., compared to a volatile selector device) of material voids or defects to trap neutral metal particles (at least at low voltage) within the RSL. The large number of voids or defects can facilitate formation of a thick, stable structure of the neutral metal particles. In such a structure, these trapped particles can maintain the non-volatile memory device in a low resistance state in the absence of an external stimulus (e.g., electrical power), thereby achieving non-volatile operation. In other embodiments, a RSL employed for a volatile selector device (volatile RSL) can have very few material voids or defects for trapping particles. Because of the few particle-trapping voids/defects, a conductive filament formed in such an RSL can be quite thin (e.g., one to a few particles wide depending on field strength, particle material or RSL material, or a suitable combination of the foregoing), and unstable absent a suitably high external stimulus (e.g., an electric field, voltage, current, joule heating, or a suitable combination thereof). Moreover, the particles can be selected to have high surface energy, and good diffusivity within the RSL. This leads to a conductive filament that can form rapidly in response to a suitable stimulus, but also deform quite readily, e.g., in response to the external stimulus dropping below a deformation magnitude (which can be lower than a formation magnitude of the external stimulus associated with forming the volatile conductive filament, e.g., in response to a current flowing through the selector device; see U.S. patent application Ser. No. 14/755,998 hereby incorporated by reference herein in its entirety and for all purposes). Note that a volatile RSL and conductive filament for the selector device can have different electrical characteristics than a conductive filament and non-volatile RSL for the non-volatile memory device. For instance, the selector device RSL can have higher material electrical resistance, and can have higher on/off current ratio, among others.

An active metal-containing layer for a filamentary-based memory cell can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), hafnium (Hf), and palladium (Pd). Other suitable conductive materials, as well as compounds, nitrides, oxides, alloys, or combinations of the foregoing or similar materials can be employed for the active metal-containing layer in some aspects of the subject disclosure. Further, a non-stoichiometric compound, such as a non-stoichiometric metal oxide/metal-oxygen or metal nitride/metal nitrogen (e.g., AlOx, AlNx, CuOx, CuNx, AgOx, AgNx, and so forth, where x is a suitable positive number or range of numbers, such as: 0<x<2, 0<x<3, 0<x<4 or other number/range of numbers depending on metal compound, which can have differing values for differing ones of the non-stoichiometric compounds) or other suitable metal compound can be employed for the active metal-containing layer, in at least one embodiment.

In one or more embodiments, a disclosed filamentary resistive switching device can include an active metal layer comprising a metal-nitrogen selected from the group consisting of: TiNx, TaNx, AlNx, CuNx, WNx and AgNx, where x is a positive number. In a further embodiment(s), the active metal layer can comprise a metal-oxygen selected from the group consisting of: TiOx, TaOx, AlOx, CuOx, WOx and AgOx. In yet another embodiment(s), the active metal layer can comprise a metal oxygen-nitrogen selected from the group consisting of: TiOaNb, AlOaNb, CuOaNb, WOaNb and AgOaNb, where a and b are positive numbers. The disclosed filamentary resistive switching device can further comprise a switching layer comprising a switching material selected from the group consisting of: SiOy, AlNy, TiOy, TaOy, AlOy, CuOy, TiNx, TiNy, TaNx, TaNy, SiOx, SiNy, AlNx, CuNx, CuNy, AgNx, AgNy, TiOx, TaOx, AlOx, CuOx, AgOx, and AgOy, where x and y are positive numbers, and y is larger than x. Various combinations of the above are envisioned and contemplated within the scope of embodiments of the present invention.

In one example, a disclosed filamentary resistive switching device comprises a particle donor layer (e.g., the active metal-containing layer) comprising a metal compound and a resistive switching layer. In one alternative embodiment of this example, the particle donor layer comprises a metal-nitrogen: MNx, e.g., AgNx, TiNx, AlNx, etc., and the resistive switching layer comprises a metal-nitrogen: MNy, e.g., AgOy, TiOy, AlOy, and so forth, where y and x are positive numbers, and in some cases y is larger than x. In an alternative embodiment of this example, the particle donor layer comprises a metal-oxygen: MOx, e.g., AgOx, TiOx, AlOx, and so on, and the resistive switching layer comprises a metal-oxygen: MOy, e.g., AgOy, TiOy, AlOy, or the like, where y and x are positive numbers, and in some cases y is larger than x. In yet another alternative, the metal compound of the particle donor layer is a MNx (e.g., AgNx, TiNx, AlNx, etc.), and the resistive switching layer is selected from a group consisting of MOy (e.g., AgOy, TiOy, AlOy, etc.) and SiOy, where x and y are typically non-stoichiometric values, or vice versa in a still further embodiment.

As utilized herein, variables x, y, a, b, and so forth representative of values or ratios of one element with respect to another (or others) in a compound can have different values suitable for respective compounds, and are not intended to denote a same or similar value or ratio among the compounds. Some details pertaining to embodiments of the subject disclosure can be found in the following U.S. patent applications that are licensed to the assignee of the present application for patent: application Ser. No. 11/875,541 filed Oct. 19, 2007 and application Ser. No. 12/575,921 filed Oct. 8, 2009; each of the foregoing patent applications are hereby incorporated by reference herein in their respective entireties and for all purposes in addition to those incorporated by reference elsewhere herein.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

In various embodiments, filamentary-based resistance switching devices can operate in a bipolar fashion, behaving differently in response to different polarity (or direction, energy flow, energy source orientation, etc.) external stimuli. For the volatile filamentary-based selector device, as an illustrative example, in response to a first polarity stimulus exceeding a first threshold voltage (or set of voltages), the filamentary selector device can change to a second resistance state from a first resistance state. Moreover, in response to a second polarity stimulus exceeding a second threshold voltage(s), the filamentary selector device can change to a third state from the first state. In some embodiments, the third state can be substantially the same as the first state, having the same or similar measurably distinct characteristic (e.g., electrical conductivity, and so forth), having the same or similar magnitude of threshold stimulus (though of opposite polarity or direction), or the like. In other embodiments, the third state can be distinct from the second state, either in terms of the measurable characteristic (e.g., different electrically conductivity value in response to the reverse polarity as compared to the forward polarity) or in terms of threshold stimulus associated with transitioning out of the first state (e.g., a different magnitude of positive voltage required to transition to the second state, compared to a magnitude of negative voltage required to transition to the third state).

For bipolar operation of a non-volatile filamentary-based memory cell, a conductive path or a filament forms through a non-volatile RSL in response to a suitable program voltage applied across the memory cell. In particular, upon application of a programming voltage, metallic ions are generated from the active metal-containing layer and migrate into the non-volatile RSL layer. The metallic ions can occupy voids or defect sites within the non-volatile RSL layer. In some embodiments, upon removal of the bias voltage, the metallic ions become neutral metal particles and remain trapped in voids or defects of the non-volatile RSL layer. When sufficient particles become trapped, a filament is formed and the memory cell switches from a relatively high resistive state, to a relatively low resistive state. More specifically, the trapped metal particles provide the conductive path or filament through the non-volatile RSL layer, and the resistance is typically determined by a tunneling resistance through the non-volatile RSL layer. In some resistive-switching devices, an erase process can be implemented to deform the conductive filament, at least in part, causing the memory cell to return to the high resistive state from the low resistive state. More specifically, upon application of an erase bias voltage, the metallic particles trapped in voids or defects of the non-volatile RSL become mobile ions and migrate back towards the active metal layer. This change of state, in the context of memory, can be associated with respective states of a binary bit. For an array of multiple memory cells, a word(s), byte(s), page(s), block(s), etc., of memory cells can be programmed or erased to represent zeroes or ones of binary information, and by retaining those states over time in effect storing the binary information. In various embodiments, multi-level information (e.g., multiple bits) may be stored in such memory cells.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known to one of ordinary skill by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

As mentioned above, applying a program voltage (also referred to as a "program pulse") to one of the electrodes of the two-terminal memory can cause a conductive filament to form in an interface layer (e.g., a RSL). By convention and as generally described herein, the TE receives the program pulse and the BE is grounded (or held at lower voltage or opposite polarity compared to the program pulse), but such is not intended to be limiting for all embodiments. Conversely, applying an "erase pulse" to one of the electrodes (generally a pulse of opposite polarity as the program pulse or to the opposite electrode as the program pulse) can break continuity of the filament, e.g., by driving the metal particles or other material that forms the filament back toward the active metal source. Properties of this conductive filament as well as its presence or absence affect the electrical characteristics of the two-terminal memory cell such as, for example, lowering the resistance and/or increasing conductance across the two terminals when the conductive filament is present as opposed to when not present.

Following program or erase pulses, a read pulse can be asserted. This read pulse is typically lower in magnitude relative to program or erase pulses and typically insufficient to affect the conductive filament and/or change the state of the two-terminal memory cell. By applying a read pulse to one of the electrodes of the two-terminal memory, a measured current (e.g., Ion) when compared to a predetermined threshold current can be indicative of the conductive state of the two-terminal memory cell. The threshold current can be preset based on expected current values in different states (e.g., high resistance state current; respective currents of one or more low resistance states, and so forth) of the two-terminal memory device, suitable for a given two-terminal memory technology. For example, when the conductive filament has been formed (e.g., in response to application of a program pulse), the conductance of the cell is greater than otherwise and the measured current (e.g., Ion) reading in response to the read pulse will be greater. On the other hand, when the conductive filament is removed (e.g., in response to application of an erase pulse), the resistance of the cell is high because the interface layer has a relatively high electrical resistance, so the conductance of the cell is lower and the measured current (e.g., Ioff) reading in response to the read pulse will be lower. By convention, when the conductive filament is formed, the memory cell is said to be in the "on-state" with a high conductance. When the conductive filament is not extant, the memory cell is said to be in the "off-state". A memory cell being in the on-state or the off-state can be logically mapped to binary values such as, e.g., "1" and "0". It is understood that conventions used herein associated with the state of the cell or the associated logical binary mapping are not intended to be limiting, as other conventions, including an opposite convention can be employed in connection with the disclosed subject matter. Techniques detailed herein are described and illustrated in connection with single-level cell (SLC) memory, but it is understood that the disclosed techniques can also be utilized for multi-level cell (MLC) memory in which a single memory cell can retain a set of measurably distinct states that represent multiple bits of information.

By mapping digital information to non-volatile resistance states of a two-terminal memory cell, digital information can be stored at such device. An electronic device containing many of these two-terminal memory cells can likewise store significant quantities of data. High density arrays are configured to contain as many memory cells as possible for a given area of chip space, thereby maximizing data storage capacity of a memory chip, or system-on-chip device.

For two-terminal memory formed at intersections of metal lines within a wafer (e.g., a crossbar array), the inventor(s) of the subject disclosure are cognizant of two general conventions for arrangement of the memory cells. A first convention is the 1T1R memory array, in which each memory cell is isolated from electrical effects (e.g., current, including leak path current(s)) of surrounding circuitry by an associated transistor. A second convention is the 1TnR memory array (n being a positive number greater than one), where a group of multiple memory cells is isolated from electrical effects of surrounding circuitry by one (or more) transistors. In the 1T1R context, individual memory cells can be configured to have high current suppression between memory cells, significantly reducing leakage path currents for the 1T1R memory array. In the 1TnR context, many individual memory cells having high device density in a given amount of silicon space can be connected to a single transistor that has much lower density. Accordingly, the 1TnR context facilitates higher bit densities for resistive memory cells on a semiconductor chip.

One example mechanism for connecting a 1T1R memory array includes a first terminal of a two-terminal resistive memory device connected to a drain of a transistor. A second terminal of the two-terminal resistive memory device can be connected to a bitline of the 1T1R memory array. The source of the transistor is grounded or used as a source for erase or program signals, depending on erase/programming conditions for the memory array. Another example mechanism involves a three-terminal memory including a transistor coupled to a volatile two-terminal resistive switching device. A first terminal of the volatile RSD is connected to a gate of the transistor, and a second terminal of the volatile RSD is connected to a voltage source. When activated, the volatile RSD permits charge to accumulate at the gate of the transistor, and when deactivated can trap that accumulated charge at the transistor gate. Other resistive switching device (RSD) circuits can be utilized within the scope of the present disclosure.

Overview

FIG. 1 illustrates a block diagram of an example resistive memory device deposition 100 according to one or more embodiments of the present disclosure. Although not specifically illustrated, resistive memory device deposition 100 can be a portion of a semiconductor device. For instance, in one or more embodiments resistive memory device deposition 100 can be situated within, between or among one or more of the substrate (or substrates for multi-substrate devices), the deposition layers, the electrical and electronic device structures, the conductive vias, the metal interconnect layers or other components known in the art that constitute the semiconductor device. As one example, resistive memory deposition 100 can be formed within backend-of-line layers of the semiconductor device. In another example, resistive memory deposition 100 can be formed within frontend-of-line layers of the semiconductor device. In still other examples, resistive memory deposition 100 can be formed in part within the backend-of-line layers and in part within the frontend-of-line layers. Moreover, the foregoing positioning can be applicable to other device depositions disclosed herein, and is not limited to resistive memory deposition 100.

Resistive memory device 100 can be formed overlying a substrate of a semiconductor device. Starting with the bottom layers, resistive memory device 100 can include an electrically conductive bottom electrode 102 formed within a void or gap in a dielectric layer 104 created by a damascene process. A bottom plate 106 is formed overlying the dielectric layer 104 and electrically conductive bottom electrode 102. In some disclosed embodiments, bottom plate 106 can be formed of tungsten (W), titanium nitride (TiN) or the like, or a suitable combination of the foregoing, and can have a thickness in a range from about 50 angstroms (Å) to about 500 Å. As utilized herein, the term "about", "approximately" and other relative terms when utilized to modify a numerical description of a disclosed structure, refer to suitable ranges about the given number that would achieve the same or similar functions as described for the disclosed structure. Where such ranges are not explicitly disclosed, a range of between 1 and 5% or between 1 and 10% the stated number can be implied, in some embodiments, or a range that would be understood by one of ordinary skill in the art to be suitable to achieve the stated functions and characteristics of the disclosed structure in other embodiments.

Overlying bottom plate 106 is a switching matrix 108. Switching matrix 108 can have a thickness in a range of about 10 Å to about 40 Å. Further, switching matrix 108 can be formed of a material configured to permit drift or diffusion of conductive particles from a source exterior to switching matrix 108 within switching matrix 108 in response to a stimulus, and configured to form a non-volatile filament of the conductive particles in response to the stimulus having suitable characteristics. The stimulus can be a voltage applied to resistive memory device 100, in an embodiment, and the suitable characteristics can include a voltage polarity and magnitude suitable to form the conductive particles into the non-volatile filament, but is not limited to this stimulus and characteristic. Other stimuli (e.g., electrical current, electrical field, temperature, or the like or a suitable combination of the foregoing) and suitable characteristics (e.g., polarity, magnitude, etc.) of the stimuli known in the art or made known to one of ordinary skill in the art by way of the context provided herein to achieve the function and characteristics of switching matrix 108 described herein are considered within the scope of the present disclosure.

Examples of the material of switching matrix 108 include $SiO_x$, amorphous Si, Si, $TiO_x$, $AlO_x$, $HfO_x$, $NiO_x$, $TaO_x$, $NbO_x$, $ZnO_2$, $ZrO_x$, $GdO_x$, a metal-nitrogen (e.g., $AlN_x$) or the like, or a suitable combination of the foregoing. X is a suitable value defining a stoichiometric or a non-stoichiometric composition depending on respective characteristics of the aforementioned compounds as stoichiometric and non-stoichiometric structures or mixtures to achieve the above-mentioned functions of switching matrix 108. For instance, where one of ordinary skill might understand non-stoichiometric $AlO_x$ to be suitable to permit drift or diffusion of conductive particles and form a non-volatile filament of such particles therein in response to a stimulus, 'x' can have a value or range of values suitable to achieve such non-stoichiometric composition of $AlO_x$. In contrast, where another compound permits drift or diffusion of conductive particles and formation of a filament of such particles as a stoichiometric compound, 'x' can have a value or range of values suitable to achieve a stoichiometric composition of such other compound. Where yet another compound permits drift or diffusion of conductive particles and formation of a filament of such particles as a non-stoichiometric compound and as a stoichiometric compound then 'x' can have a value(s) or range(s) of values suitable to achieve such non-stoichiometric and stoichiometric compositions.

In one or more embodiments, a metal-oxygen material (or metal-nitrogen), such as an oxygen poor metal oxide or an oxygen rich metal oxide, utilized for switching matrix 108 can have a Si dopant in the metal material of less than 2% Si by atomic weight. Thus, for example, a metal-oxygen comprising $AlO_x$ can also comprise 2% or less Si by atomic weight (e.g., between about 0.5% and about 1% in an embodiment). The silicon doping can be implemented by including less than 2% silicon by atomic weight into a sputtering target comprising the metal of the metal-oxygen. While the silicon doped metal is deposited on top of bottom plate 106, oxygen is provided to the resistive memory device deposition 100 to oxidize the silicon doped metal to form the metal-oxygen material with silicon doping.

In an embodiment, the following process can be implemented to mitigate or avoid oxidation of bottom plate 106. In such embodiment, a silicon doped metal sputtering target can be oxidized to form a metal oxide film about a perimeter of the silicon doped metal sputtering target. As a result, initial deposition involves sputtering of silicon doped metal oxide onto bottom plate 106, for a few to several seconds (e.g., 2-10 seconds, depending on deposition rate). This results in a few angstroms depth (e.g., 5-15 angstroms) of sputtered silicon doped metal oxygen onto bottom plate 106. Subsequently, reactive oxygen flow is initiated to oxide the silicon doped metal material subsequently sputtered onto the few to several angstroms depth of sputtered silicon doped metal oxygen to continue forming the switching matrix 108.

Overlying switching matrix 108 is a switching material—filament donor 110. Switching material—filament donor 110 can have a thickness in a range of about 50 Å to about 500 Å, in various embodiments. In further embodiments, switching material—filament donor 110 can comprise a material selected to provide conductive particles to switching matrix 108 in response to a suitable stimulus (e.g., as described above). Example materials for switching material—filament donor 110 can include Al, a non-stoichiometric AlNx, a stoichiometric or non-stoichiometric $AlNO_x$, TiN, Ti, W or the like, or a suitable combination of the foregoing. Overlying switching material—filament donor 110 is an optional second barrier material 112 having a thickness in a range of about 50 Å and about 500 Å and comprised of an electrically conductive material including Ti, W or the like, or a suitable combination of the foregoing. In some embodiments, resistive memory deposition 100 does not include second barrier material 112.

In still other embodiments, a metal (e.g., Al) or a metal-nitrogen (or metal oxide), such as a nitrogen poor metal nitride or nitrogen rich metal nitride, utilized for switching material—filament donor 110 can have a Si dopant in the metal material of less than 2% Si by atomic weight. Thus, for example, an aluminum metal or a metal-nitrogen material comprising $AlN_x$ can also comprise 2% or less Si by atomic weight (e.g., between about 0.5% and about 1% in an embodiment). The silicon doping can be implemented by including less than 2% silicon by atomic weight into a sputtering target comprising the metal of the metal-nitrogen. While the silicon doped metal is deposited on top of switching matrix 108, nitrogen gas is provided to the resistive memory device deposition 100 during the depositing of the silicon doped metal to form the metal-nitrogen with silicon doping.

Overlying switching material—filament donor 110 (and optionally second barrier material 112) is a barrier material/top electrode 114. Barrier material/top electrode 114 can have a thickness in a range of about 200 Å and about 1500 Å, and can comprise a material including TiN, Ti, W, TaN or the like, or a suitable combination of the foregoing. Dielectric hard mask 116 overlies barrier material/top electrode 114 and can comprise a material selected from SiO2, SiN, SiC, SiON, amorphous carbon or the like, or a suitable combination of the foregoing. Additionally, a patterned photoresist 118 can overlie dielectric hard mask 116, as is known in the art.

Figure 2:
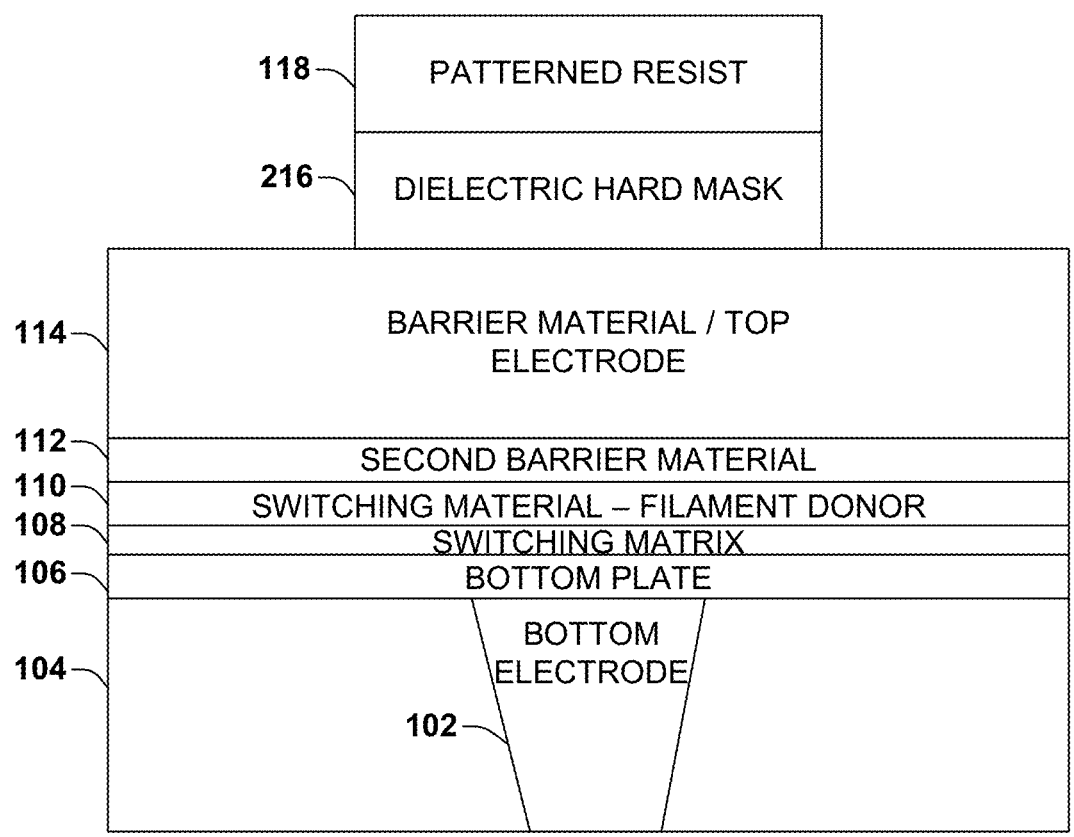
FIGS. 2-5 depict an example process for forming discrete resistive switching memory devices from the deposition of FIG. 1, according to further embodiments.

FIG. 2 illustrates a block diagram of a first etch: hard mask plasma etch 200 for the resistive memory deposition 100 of FIG. 1, supra. The first etch utilizes patterned resist 118 as a mask to etch dielectric hard mask 116 and form etched dielectric hard mask 216. First etch: hard mask plasma etch 200 can be a plasma etch utilizing a gas selected from a group consisting of: $C_4F_8$, $C_4F_6$, $CHF_3$, $CF_4$, CO, $O_2$, $N_2$ and Ar. The first etch: hard mask plasma etch 200 is stopped when barrier material/top electrode 114 is reached, resulting in resistive memory deposition 100 substantially as depicted by FIG. 2.

Figure 3:
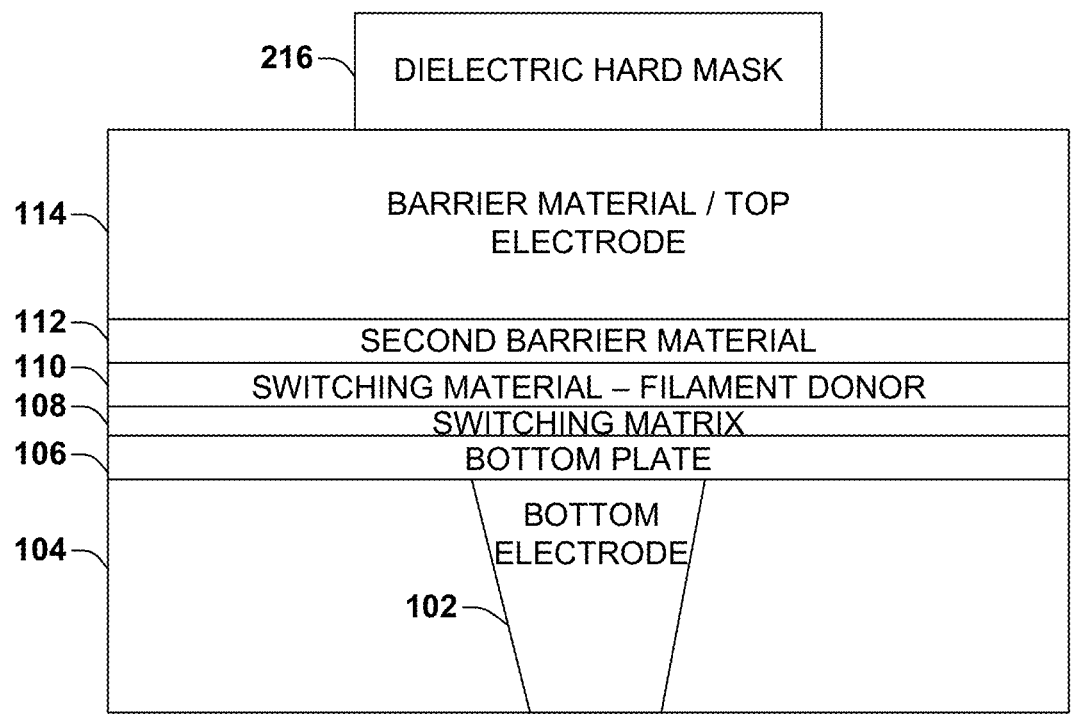

FIG. 3 depicts a block diagram of a photoresist (PR) strip/post etch clean 300. PR strip/post etch clean 300 removes patterned resist 118 from above etched dielectric hard mask 216. Patterned resist 118 can be removed with an $O_2$ ash, an $O_2/CF_4$ ash or the like, or a suitable combination of the foregoing. Following removal of patterned resist 118 a clean process to remove debris or remnants from the removal of patterned resist 118 or prepare a top surface of etched dielectric hard mask 216. The clean process can utilize a dimethyl sulfoxide (DMSO) rinse, an EKC rinse, a hydrogen fluoride (HF) clean, a deionized (DI) water rinse or the like, or a suitable combination of the foregoing.

Figure 4:
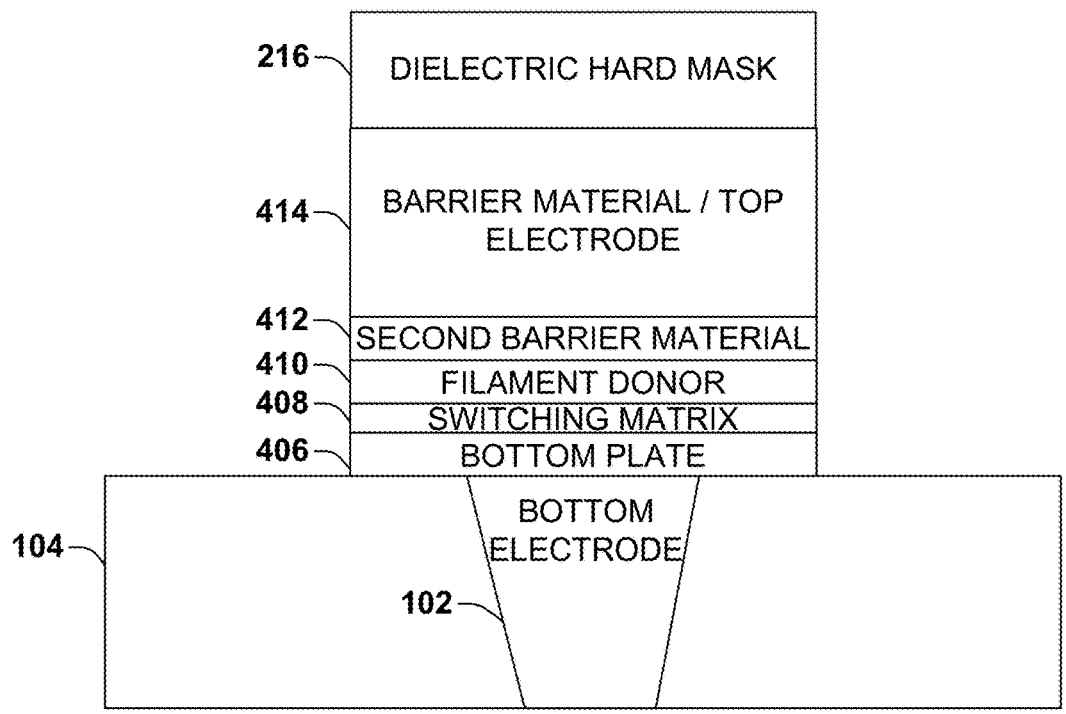

FIG. 4 illustrates a block diagram of a second etch: plasma gas etch and post-etch clean 400 according to further embodiments of the present disclosure. A second etch is implemented utilizing the etched dielectric hard mask as a mask for the second etch. The second etch removes barrier material/top electrode 114, (optional second barrier material 112, if present), switching material—filament donor 110, switching matrix 108 and bottom plate 106 to form etched barrier material/top electrode 414, optionally etched second barrier material 412 (if present), etched switching material—filament donor 410, etched switching matrix 408 and etched bottom plate 406. The second etch can stop on dielectric layer 104 and can be a plasma etch utilizing a gas selected from a group consisting of: $Cl_2$, $BCl_3$, HBr, Ar, $N_2$, He, $O_2$, $CHF_3$, $CF_4$, and $SF_6$. A post etch clean utilizing $O_2$ ash, a dilute HF, an ultra-dilute HF, an EKC clean, sulfuric peroxide mixture (SPM) rinse, a $H_2O_2$ rinse, a tetramethyl-ammonium hydroxide (TMAH) rinse, a DI water rinse, or the like, or a suitable combination of the foregoing is utilized to complete second etch: plasma gas etch and post-etch clean 400.

Figure 5:
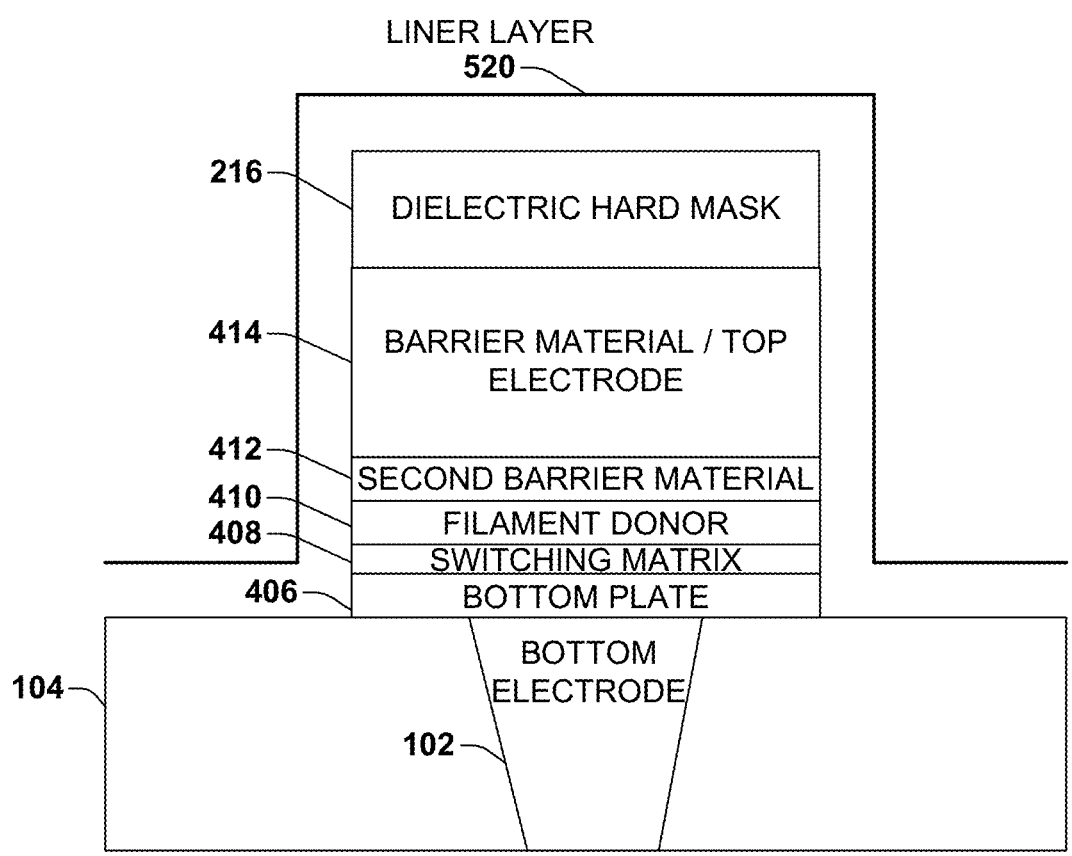

FIG. 5 illustrates a block diagram of a liner layer deposition 500 according to one or more further embodiments of the present disclosure. Liner layer deposition 500 can overlie a surface(s) of dielectric layer 104 exposed by second etch: plasma gas etch and post-etch clean 400 and can overlie etched dielectric hard mask 216, etched barrier material/top electrode 414, etched second barrier material 412 (if present), etched switching material—filament donor 410, etched switching matrix 408 and etched bottom plate 406. The liner layer can be formed of a material comprising SiN, SiON, SiC, atomic layer deposition (ALD) $AlO_x$, or the like or a suitable combination of the foregoing.

Figure 6:
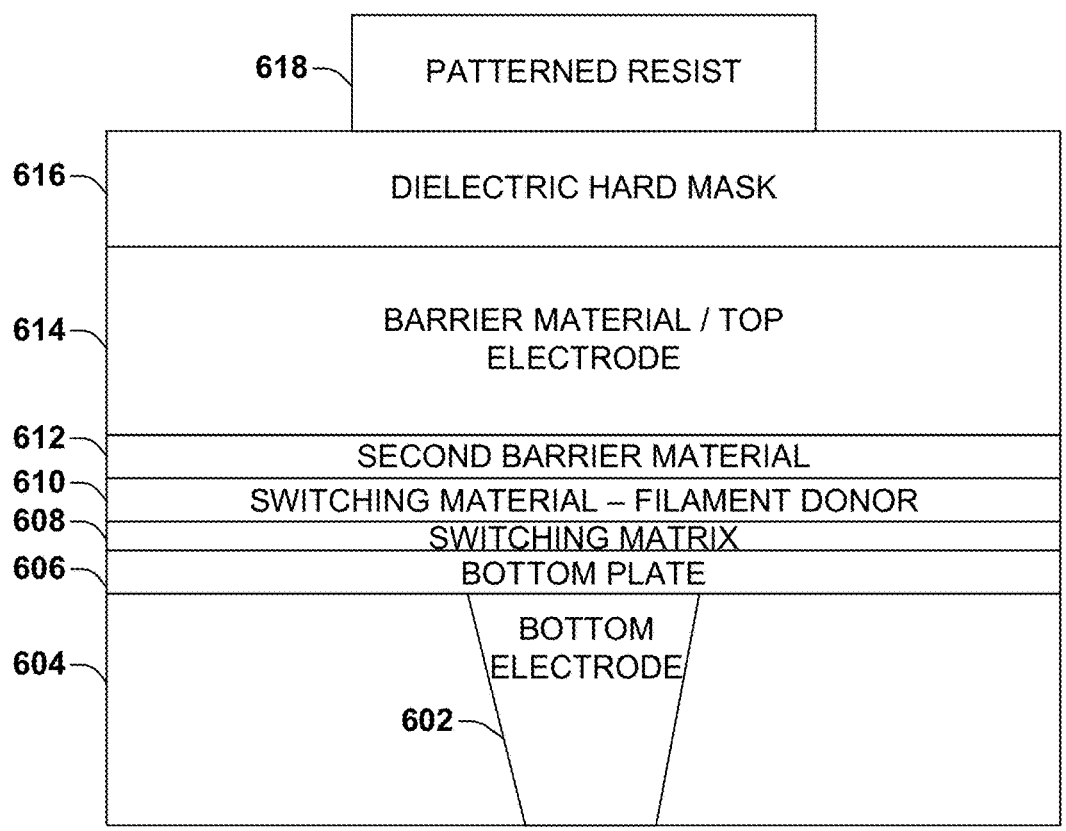
FIG. 6 depicts a diagram of a sample deposition for a resistive switching memory according to alternative or additional embodiments disclosed herein.

FIG. 6 depicts a block diagram of a resistive memory deposition 600 according to alternative or additional embodiments of the present disclosure. Although not specifically illustrated, resistive memory device deposition 600 can be a portion of a semiconductor device (e.g., similar to that described for resistive memory device deposition 600 of FIG. 1, infra). Resistive memory deposition 600 includes a bottom electrode 602 formed within a void or gap of a dielectric material 604 (e.g., created as part of a damascene process). A bottom plate 606 is formed over the dielectric material 604 and bottom electrode 602, and a switching matrix 608 is formed over bottom plate 606. Additionally, a switching material—filament donor 610 is formed over switching matrix 608, an optional second barrier material 612 can optionally be formed over switching material—filament donor 610, a barrier material/top electrode 614 formed over switching material—filament donor 610 (and optional second barrier material 612, if present), and a dielectric hard mask 616 is formed over barrier material/top electrode 614. Also as illustrated, a patterned photoresist 618 is formed overlying dielectric hard mask 616. In one or more embodiments, respective layers of resistive memory deposition 600 can have thicknesses and material compositions substantially similar to those provided with respect to FIG. 1, infra.

Figure 7:
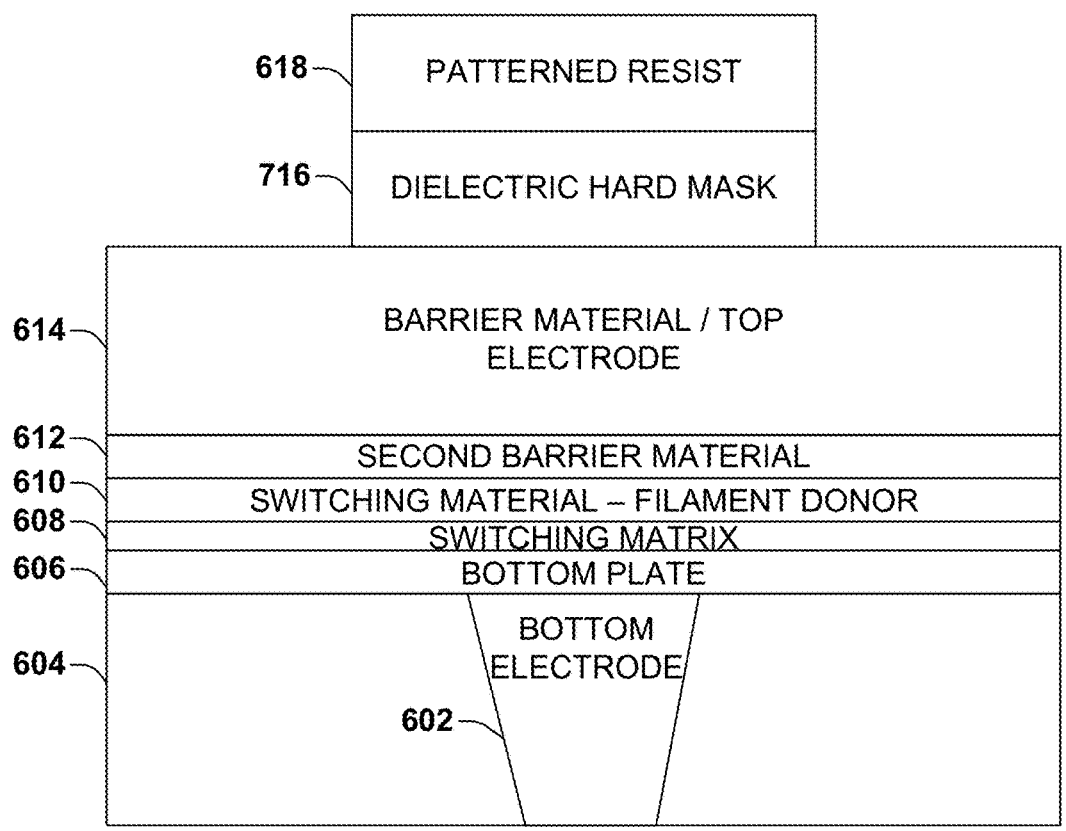
FIGS. 7-12 illustrate a further example process for forming discrete resistive switching memory devices from the deposition of FIG. 6, in further disclosed embodiments.
Figure 8:
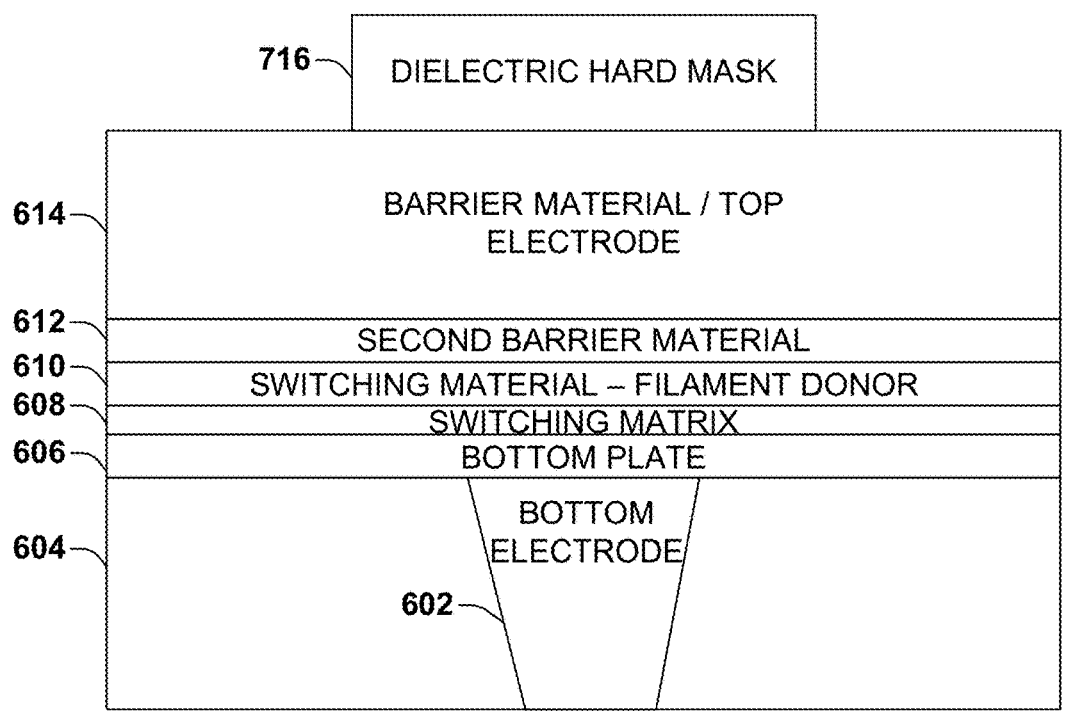

FIG. 7 depicts a block diagram of a sample first etch: hard mask plasma etch 700 in one or more embodiments of the present disclosure. The first etch can include a hard mask plasma etch comprising a gas selected from a group consisting of: $C_4F_8$, $C_4F_6$, $CHF_3$, $CF_4$, CO, $O_2$, $N_2$ and Ar. The first etch: hard mask plasma etch 700 is stopped when barrier material/top electrode 614 is reached, resulting in etched dielectric hard mask 716 overlying lower layers of resistive memory deposition 600 substantially as depicted by FIG. 7. FIG. 8 depicts a block diagram of a PR strip/post etch clean 800 according to further embodiments of the present disclosure. PR strip/post etch clean 800 removes patterned photoresist 618 overlying etched dielectric hard mask 716, and cleans surfaces of etched dielectric hard mask 716 and barrier material/top electrode 614 exposed by first etch: hard mask plasma etch 700. The PR strip can utilize a $O_2$ ash or $O_2/CF_4$ ash, and the post etch clean can utilize an EKC, a DMSO, a HF or a DI water rinse, or the like or a suitable combination of the foregoing.

Figure 9:
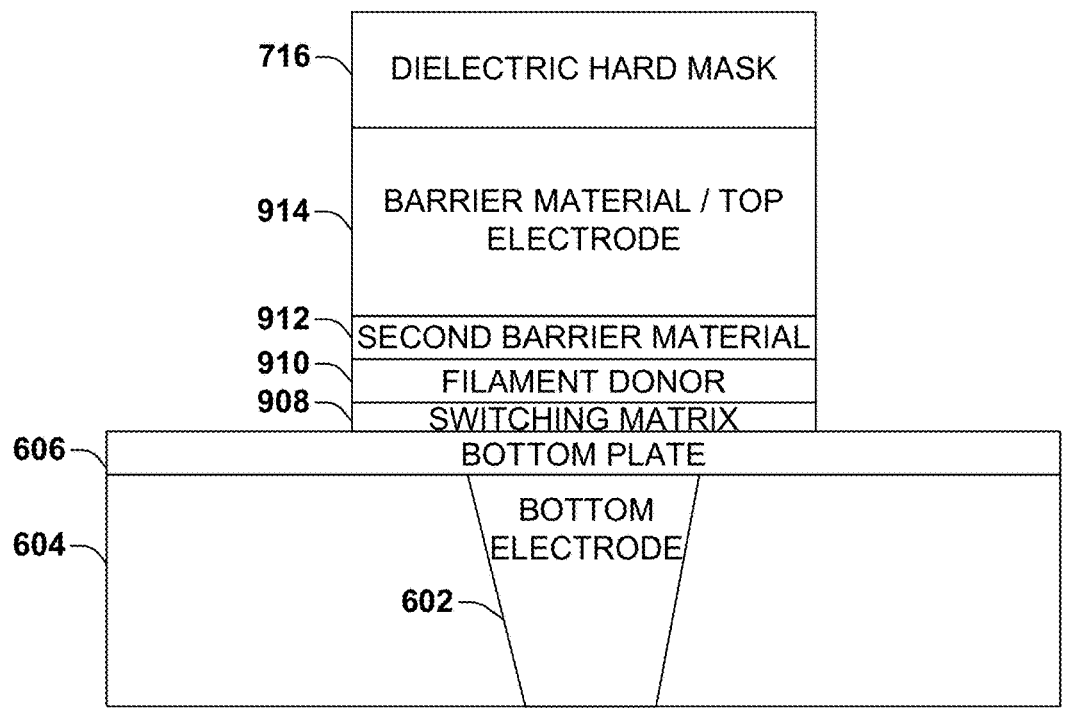

FIG. 9 illustrates a block diagram of a sample second etch 900 according to one or more additional embodiments of the subject disclosure. Second etch 900 removes portions of barrier material/top electrode 614, optional second barrier material 612 (if present), switching material—filament donor 610, and switching matrix 608. Dielectric hard mask 716 serves as a mask for second etch 900, in various embodiments. Following second etch 900 an etched barrier material/top electrode 914, optionally an etched second barrier material 912 (if present), an etched switching material—filament donor 910 and an etched switching matrix 908 are formed. Second etch 900 can stop on bottom plate 606. In various embodiments, second etch 900 can be a plasma etch utilizing a gas selected from a group consisting of: $Cl_2$, $BCl_3$, HBr, Ar, $N_2$, He, $O_2$, $CHF_3$, $CF_4$ and $SF_6$ and can further include a post etch clean comprising $O_2$ ash, a dilute HF, an ultra-dilute HF, an EKC, a SPM, a $H_2O_2$, a TMAH or a DI water rinse.

Figure 10:
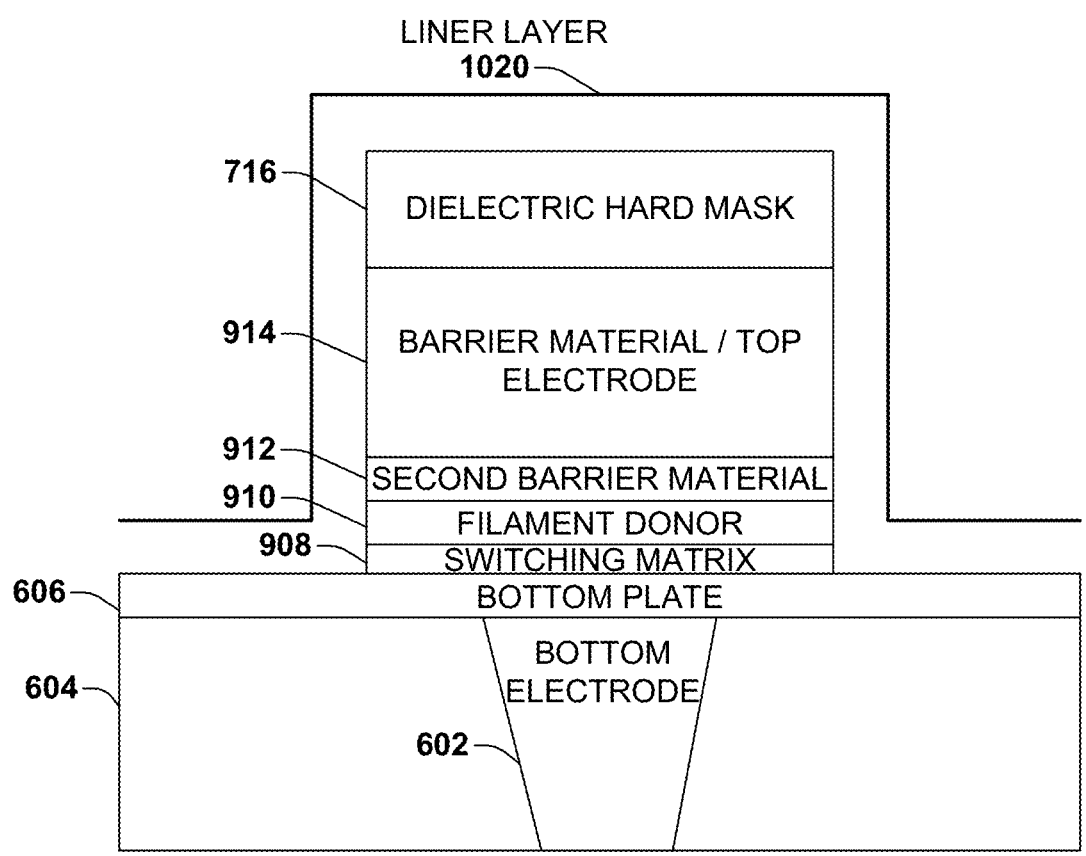

FIG. 10 depicts a block diagram of an example optional liner layer deposition 1000 that forms an optional liner layer 1020 over surfaces of bottom plate 606 and of etched switching matrix 908, etched switching material—filament donor 910, optional etched second barrier material 912 (if present), etched barrier material/top electrode 914 exposed by second etch 900, and etched dielectric hard mask 716. Liner layer deposition 1000 can form liner layer 1020 of SiN, SiON, SiC, or an ALD AlOx, or the like or a suitable combination of the foregoing, where liner layer deposition 1000 is utilized.

Figure 11:
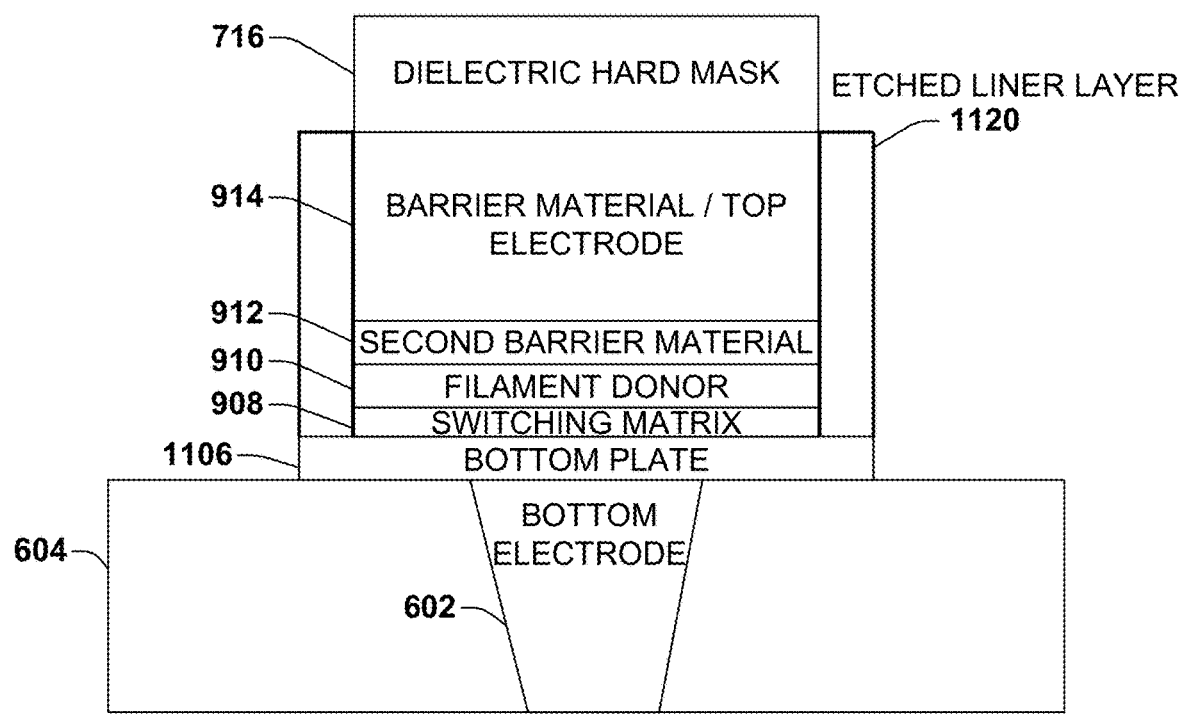
Figure 12:
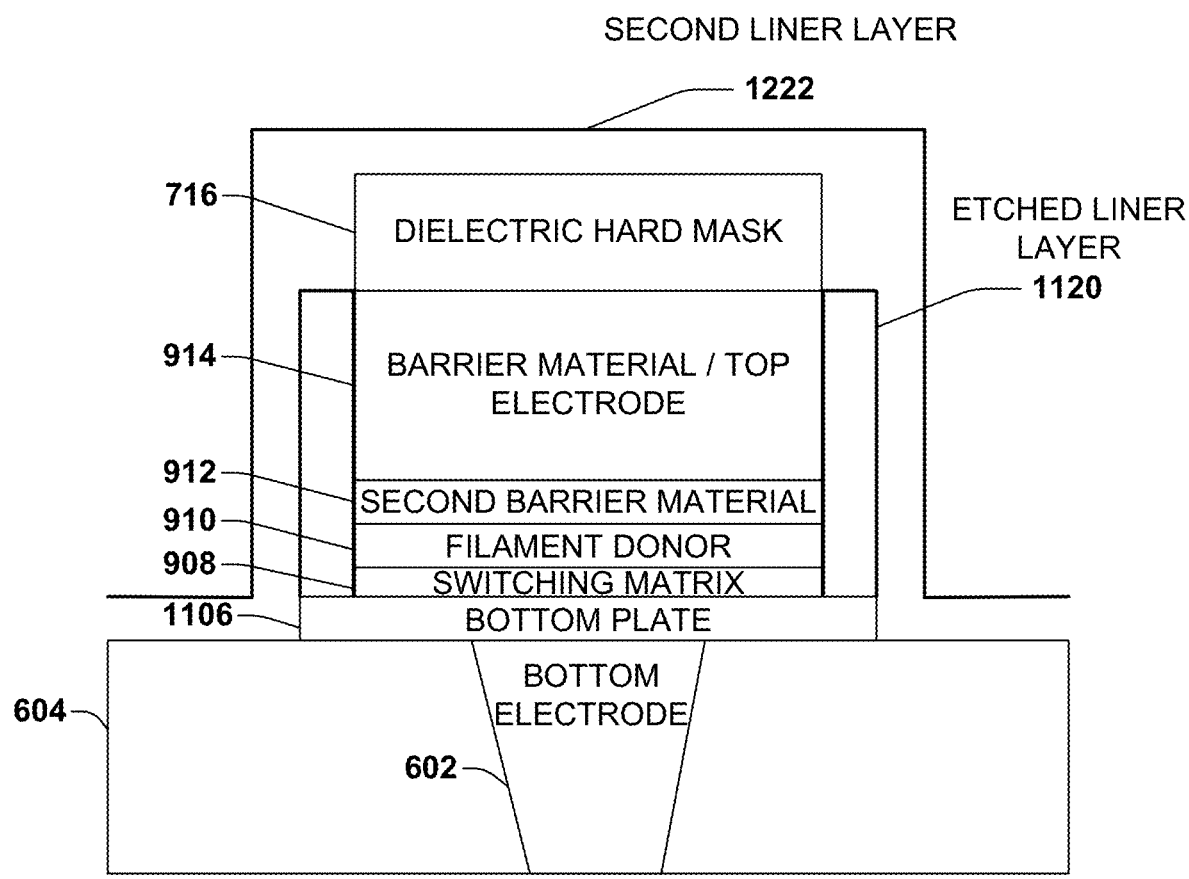

FIG. 11 illustrates a block diagram of a sample third etch: liner etch-back and bottom plate etch 1100. The third etch removes optional liner layer 1020 (if present) overlying etched dielectric hard mask 716. In addition, the third etch removes optional liner layer 1020 (if present) overlying bottom plate 606, removes portions of bottom plate 606 and stops on dielectric layer 604, forming etched bottom plate 1106 and optionally etched liner layer 1120. FIG. 12 illustrates a second optional liner deposition 1200 to optionally deposit a second optional liner layer 1222 overlying a surface of dielectric layer 604 exposed by third etch: liner etch-back and bottom plate etch 1100, overlying optional etched liner layer 1120 (if present) and overlying etched dielectric hard mask 716, as illustrated.

Figure 13:
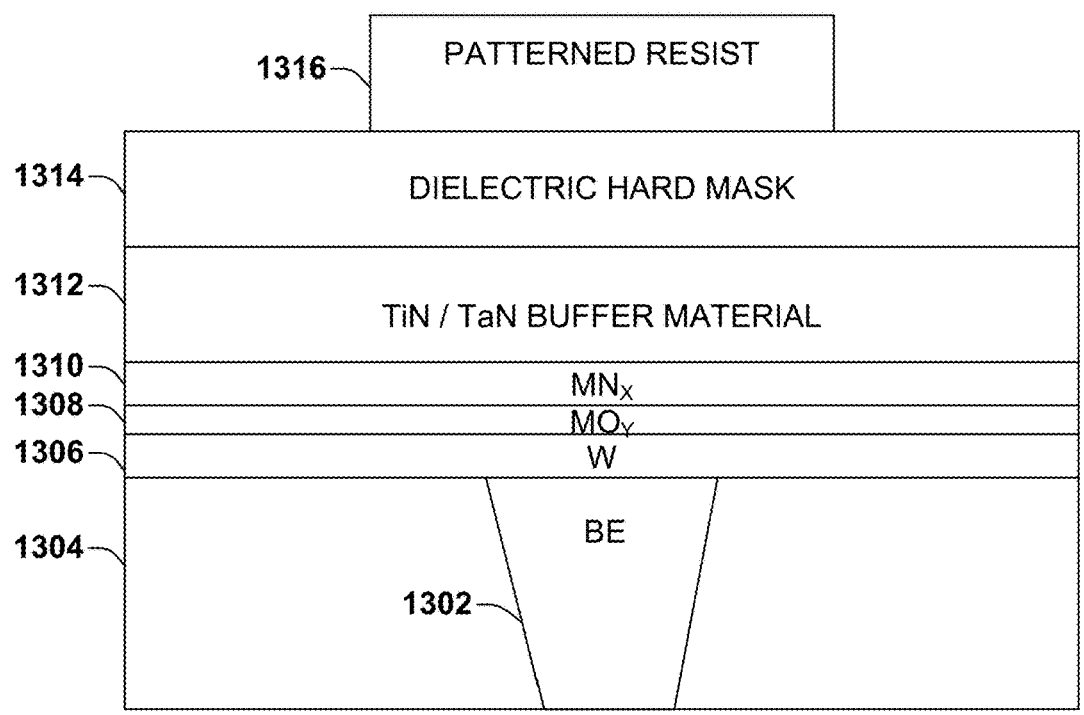
FIG. 13 depicts a diagram of a deposition for a resistive switching memory in one or more other disclosed embodiments.

FIG. 13 illustrates a resistive memory deposition 1300 according to still further embodiments of the present disclosure. Resistive memory deposition 1300 can include a dielectric layer 1304 and a bottom electrode (BE) 1302 formed within dielectric layer 1304. A tungsten (W) layer 1306 is formed overlying dielectric layer 1304 and BE 1302. Moreover, a metal-oxygen (MOy) layer 1308 overlies W layer 1306, and a metal-nitrogen (MNx) layer 1310 overlies MOy layer 1308. MOy layer 1308 is configured to permit drift or diffusion of conductive metal particles from MNx layer 1310 into MOy layer 1308, and configured to form a conductive filament of the conductive metal particles through at least a portion of MOy layer 1308 in response to a stimulus applied to a resistive memory device, and MNx layer 1310 is configured to provide the conductive metal particles to MOy layer 1308 in response to the stimulus. 'Y' and 'X' are suitable positive numbers for forming non-stoichiometric structures of MOy and MOx, respectively, and for achieving the characteristics of the respective layers described herein. Metals "M" for MNx layer 1310 and MOy layer 1308 can be the same metal, or different metals in various disclosed embodiments. As one example, M can be aluminum and MNx layer 1310 can be a AlNx layer and MOy layer 1308 can be a AlOy layer, whereas in other examples MNx layer 1310 can comprise a first metal and MOy layer 1308 can comprise a second metal different from the first metal.

Overlying MNx layer 1310 is a TiN or TaN buffer material (TiN/TaN buffer material) 1312. A dielectric hard mask 1314 overlies TiN/TaN material 1312, and can comprise a $SiO_2$ material, a SiN material, a SiC material, a SiON material, an amorphous carbon material, or the like, or a suitable combination of the foregoing. Moreover, a patterned resist 1316 overlies dielectric hard mask 1314.

Figure 14:
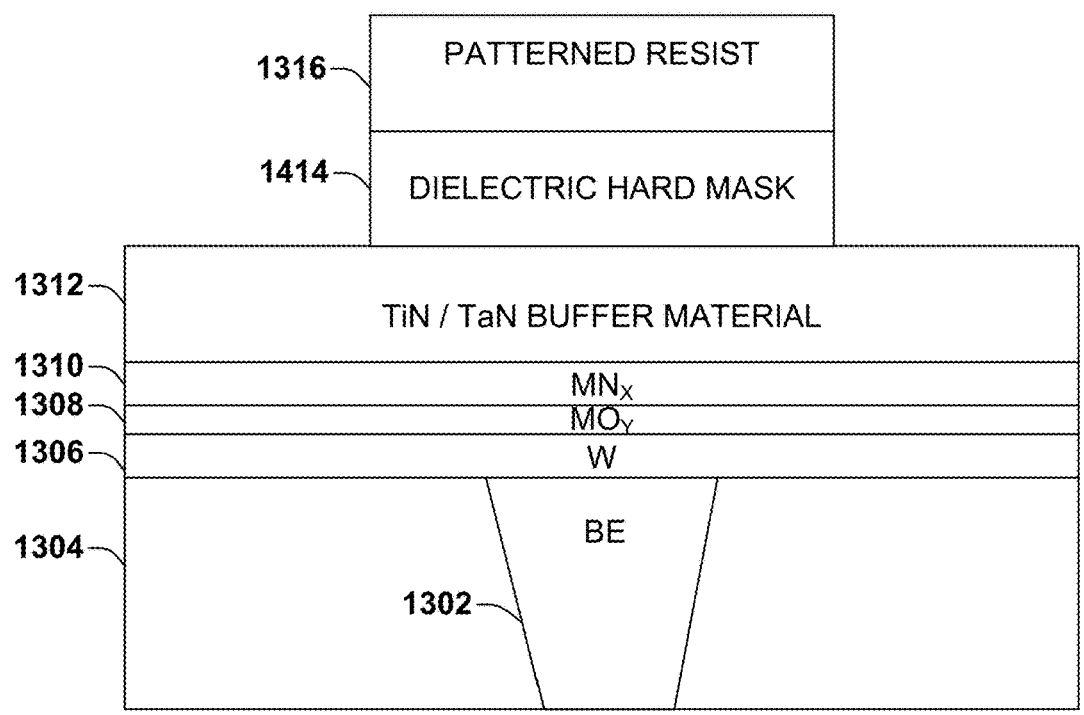
FIGS. 14, 14A, 14B, 15, 15A, 15B, 16, 16A and 16B illustrate diagrams of example processes for fabricating discrete non-volatile resistive switching devices from the deposition of FIG. 13, in an embodiment(s)

FIG. 14 illustrates a block diagram of a sample first etch: hard mask plasma etch 1400 according to one or more embodiments of the present disclosure. The first etch utilizes patterned resist 1316 as a mask to etch dielectric hard mask and form etched dielectric hard mask 1414. First etch: hard mask plasma etch 1400 can be a hard mask etch disclosed elsewhere with respect to other hard mask etches in the present disclosure, in some embodiments. In further embodiments, first etch: hard mask plasma etch 1400 can be an oxide etch chemistry. In an embodiment, first etch: hard mask plasma etch 1400 can be a chlorine chemistry etch, a fluorine chemistry etch or a suitable combination of the foregoing. In at least one embodiment, the hard mask etch can be a $CHF_3$ etch. In the various embodiments, first etch: hard mask plasma etch 1400 stops on TiN/TaN buffer material 1312.

Figure 14A:
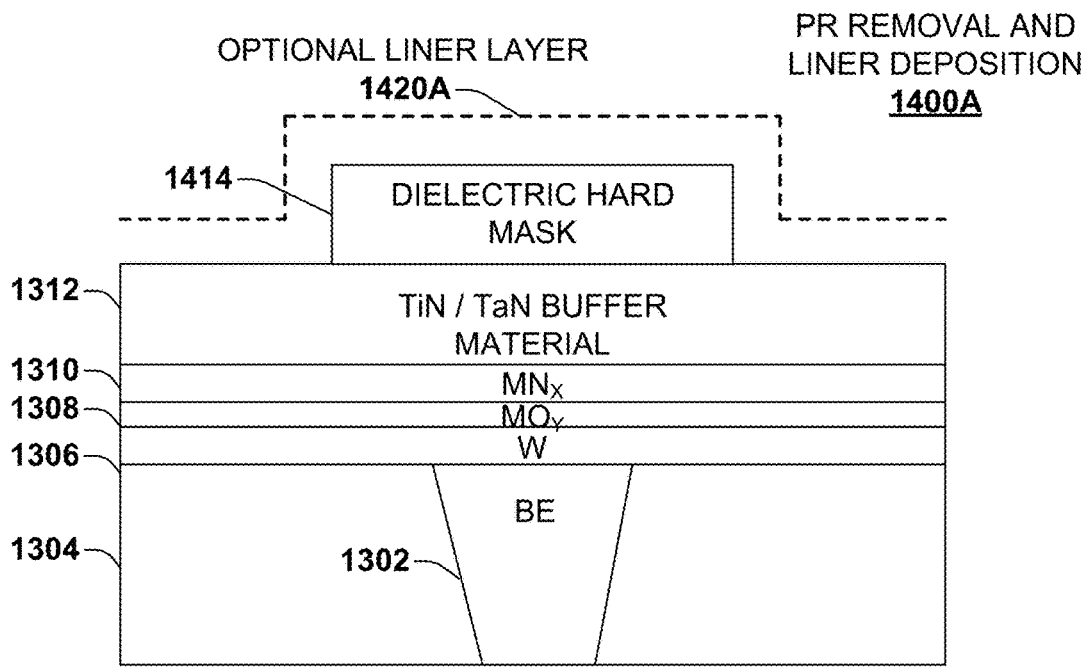
Figure 14B:
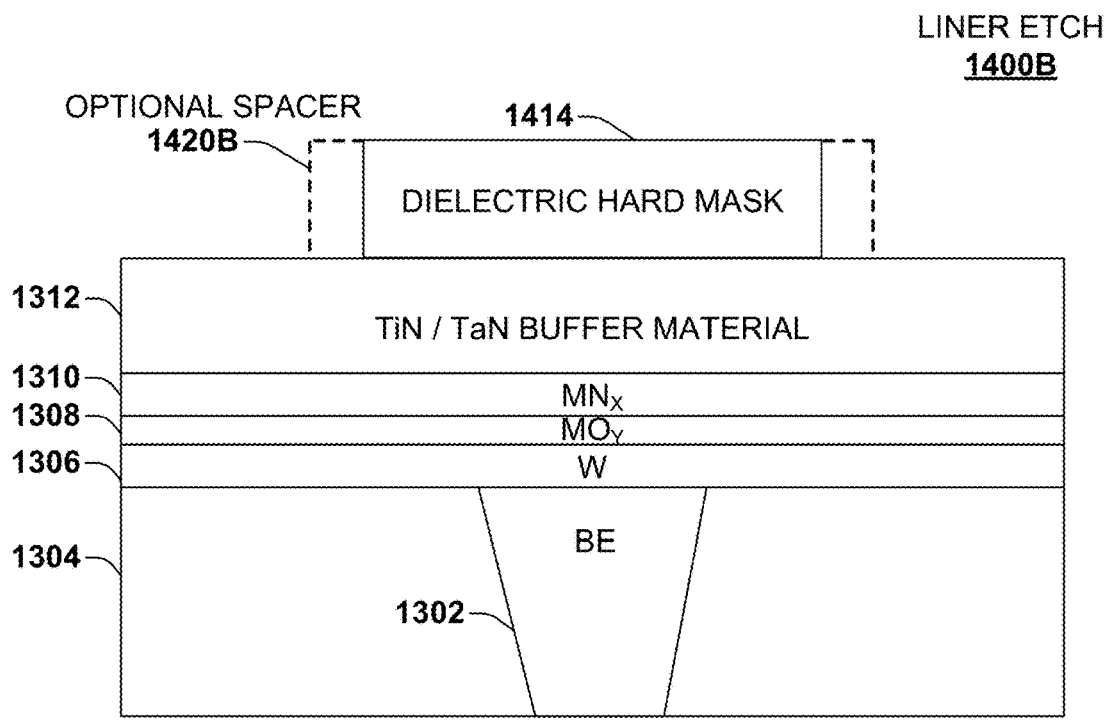

FIG. 14A depicts a photoresist removal and optional liner deposition 1400A, in further embodiments. Patterned resist 1316 can be removed with any PR strip chemistry disclosed herein or known in the art, e.g., $O_2$ ash, $O_2/CF_4$ ash followed by an EKC, DMSO, HF or DI water clean. Subsequently, an optional liner layer 1420A can be formed over etched dielectric hard mask 1414 and over a surface of TiN/TaN buffer material 1312. At FIG. 14B an optional liner etch 1400B is provided to remove optional liner layer 1420A from a top surface of etched dielectric hard mask 1414 and expose a top surface of TiN/TaN buffer material 1312 to form an optional spacer 1420B. Optional liner layer 1420A can be formed of one or more materials selected from a group consisting of: SiN, SiO, SiON, SiC, and SiOC.

Figure 15:
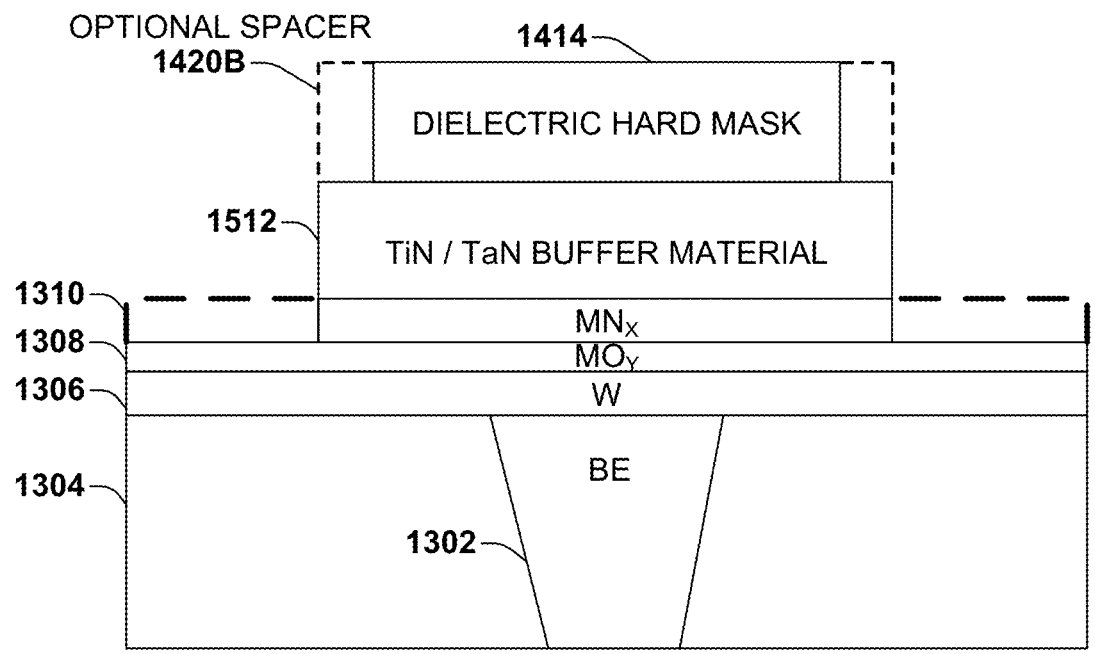

FIG. 15 illustrates a block diagram of an example second etch: buffer material 1500 according to further embodiments. Second etch: buffer material 1500 utilizes etched dielectric hard mask 1414 as a mask for etching TiN/TaN buffer material 1312 and optionally for etching MNx layer 1310. Following second etch: buffer material 1500 an etched TiN/TaN buffer material 1512 is formed (and optionally an etched metal-nitrogen layer 1610, see FIG. 16, infra). In various embodiments, the second etch can be a plasma etch comprising one or more of the following gases: $Cl_2$, $BCl_3$, HBr, Ar, $N_2$, He, $O_2$, $CHF_3$, $CF_4$, or $SF_6$. In one or more embodiments, the second etch can be followed by a post etch clean, comprising an $O_2$ ash, a dilute HF, an ultra-dilute HF, an EKC, a SPM, a $H_2O_2$, a TMAH or a DI water rinse. In some embodiments, the second etch can utilize $BCl_3$ chlorine in a ratio of 1:1 to 3:1. In additional embodiments, the second etch can be a fluorine-free etch chemistry.

Figure 15A:
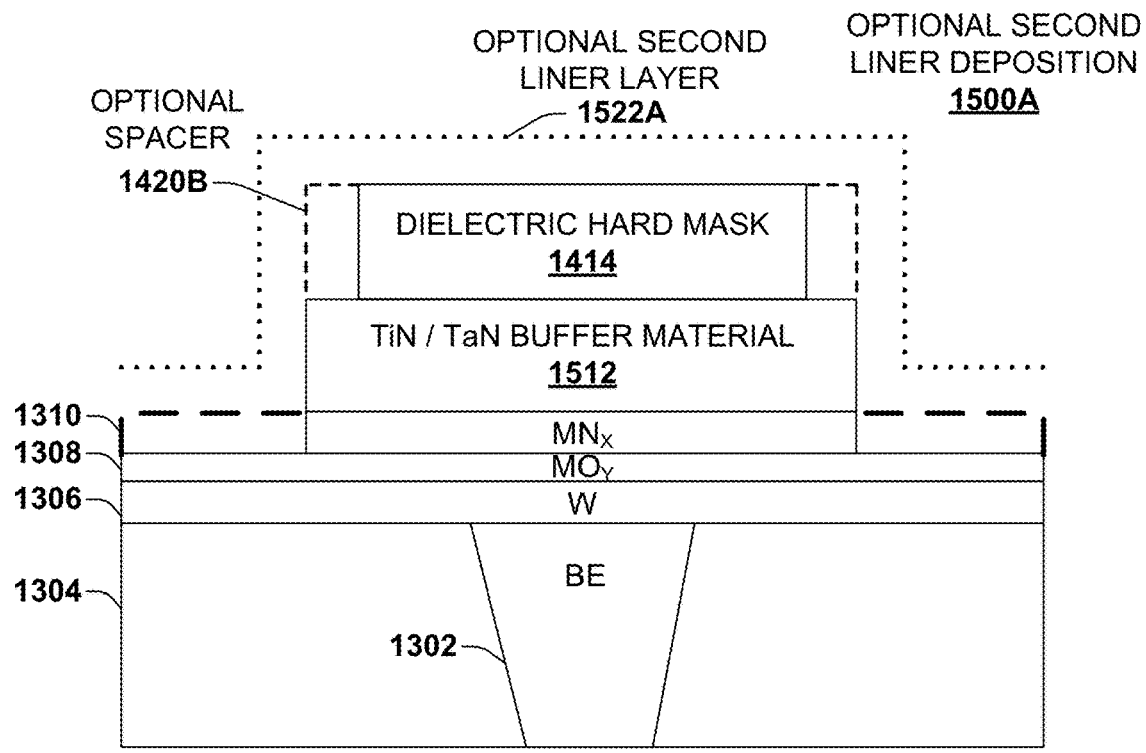
Figure 15B:
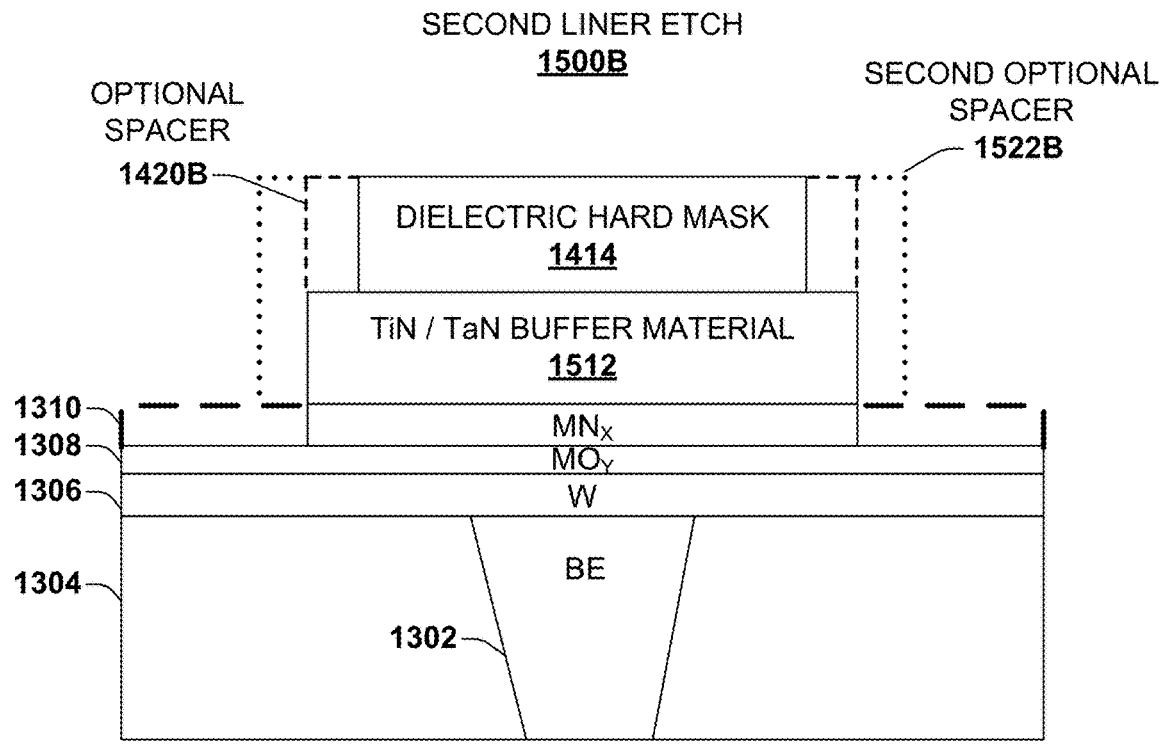

FIGS. 15A and 15B illustrate example optional spacer etches, according to further embodiments of the present disclosure. Referring initially to FIG. 15A, an optional second liner deposition 1500A is implemented to create an optional second liner layer 1522A. Note that in some embodiments, where MNx layer 1310 is etched to produce etched metal-nitrogen layer 1610 as part of second etch: buffer material 1500, optional second liner layer 1522A can extend to MOy layer 1308. An optional second liner etch 1500B is illustrated at FIG. 15B to remove optional second liner layer 1522A from the top of dielectric hard mask 1414, producing second optional spacer 1522B. In embodiments where MNx layer 1310 is etched as part of second etch: buffer material 1500, second optional spacer 1522B extends along sidewalls of etched metal-nitrogen layer 1610 to MOy layer 1308. Optional second liner layer 1522A can be formed of one or more materials selected from a group consisting of: SiN, SiO, SiON, SiC, and SiOC.

Figure 16:
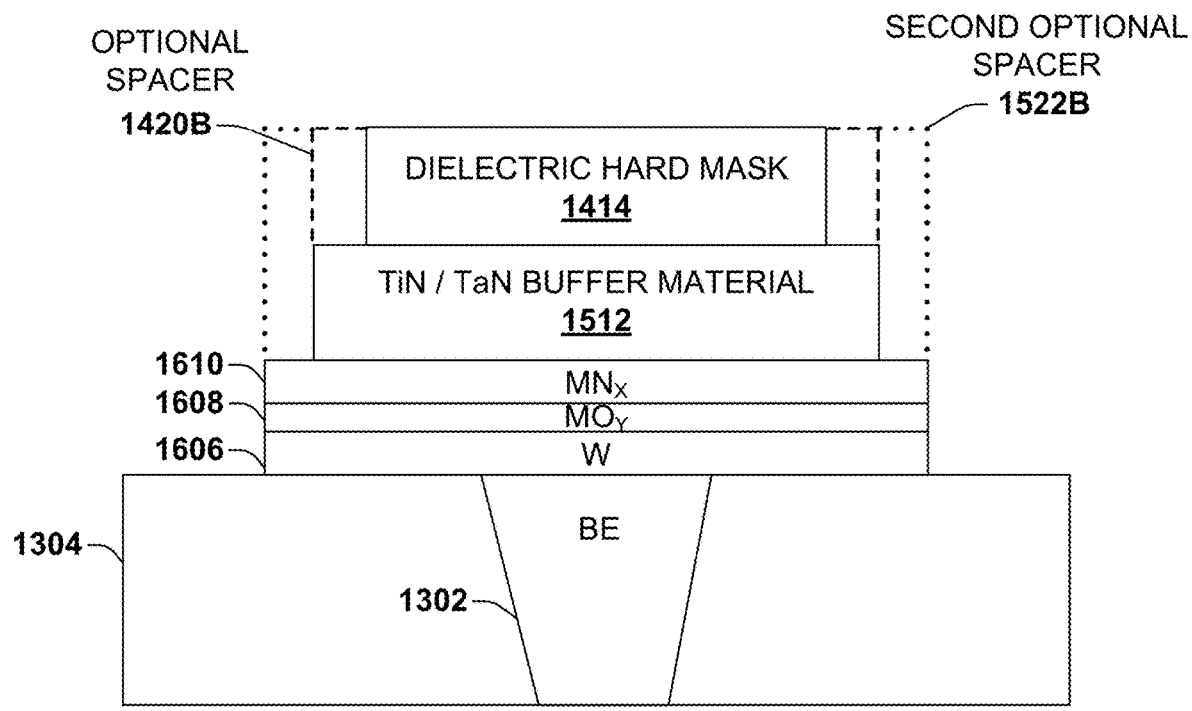

FIG. 16 depicts a block diagram of an example third etch: switching matrix and bottom plate 1600 according to alternative or additional embodiments of the present disclosure. The third etch can etch through MOy layer 1308, and W layer 1306 (and in some embodiments on MNx layer 1310) stopping on dielectric layer 1304. Following the third etch, the memory device includes etched W layer 1606, etched MOy layer 1608, etched MNx layer 1610, etched TiN/TaN buffer material 1512 and etched dielectric hard mask 1414. In various embodiments, the third etch can be a plasma etch comprising one or more of the following gases: $Cl_2$, $BCl_3$, HBr, Ar, $N_2$, He, $O_2$, $CHF_3$, $CF_4$, or $SF_6$. In one or more embodiments, the second etch can be followed by a post etch clean, comprising an $O_2$ ash, a dilute HF, an ultra-dilute HF, an EKC, a SPM, a $H_2O_2$, a TMAH or a DI water rinse. Moreover, an optional spacer 1420B or second optional spacer 1522B can be provided, in various embodiments.

Figure 16A:
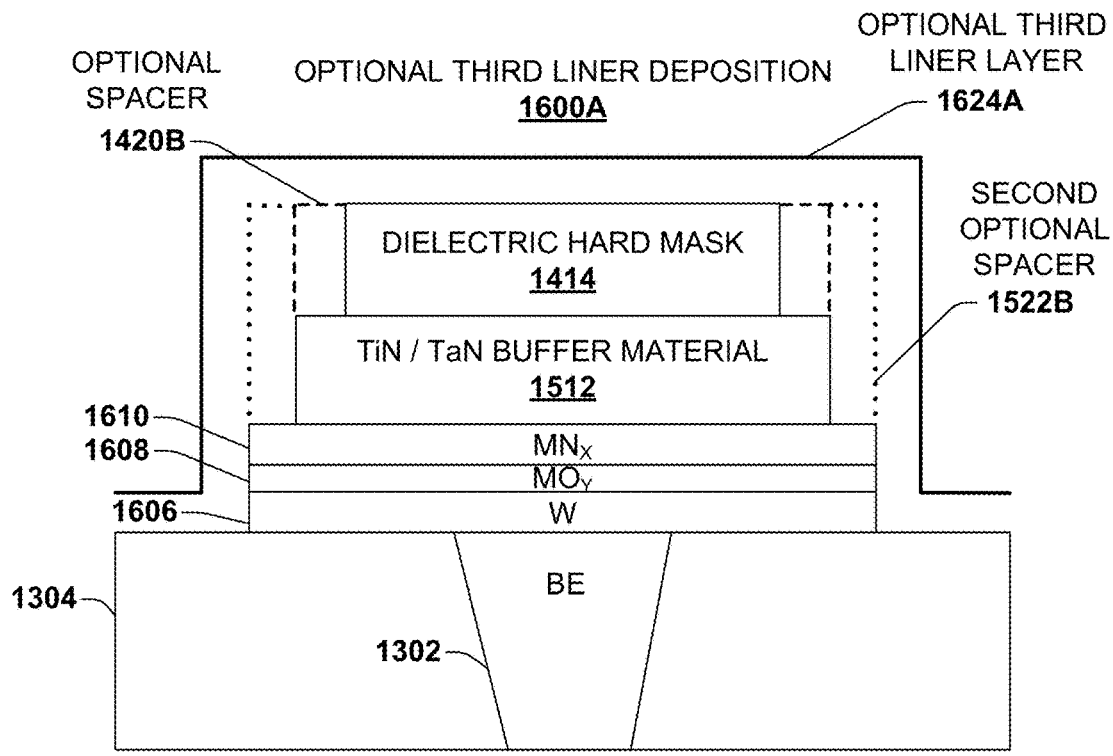
Figure 16B:
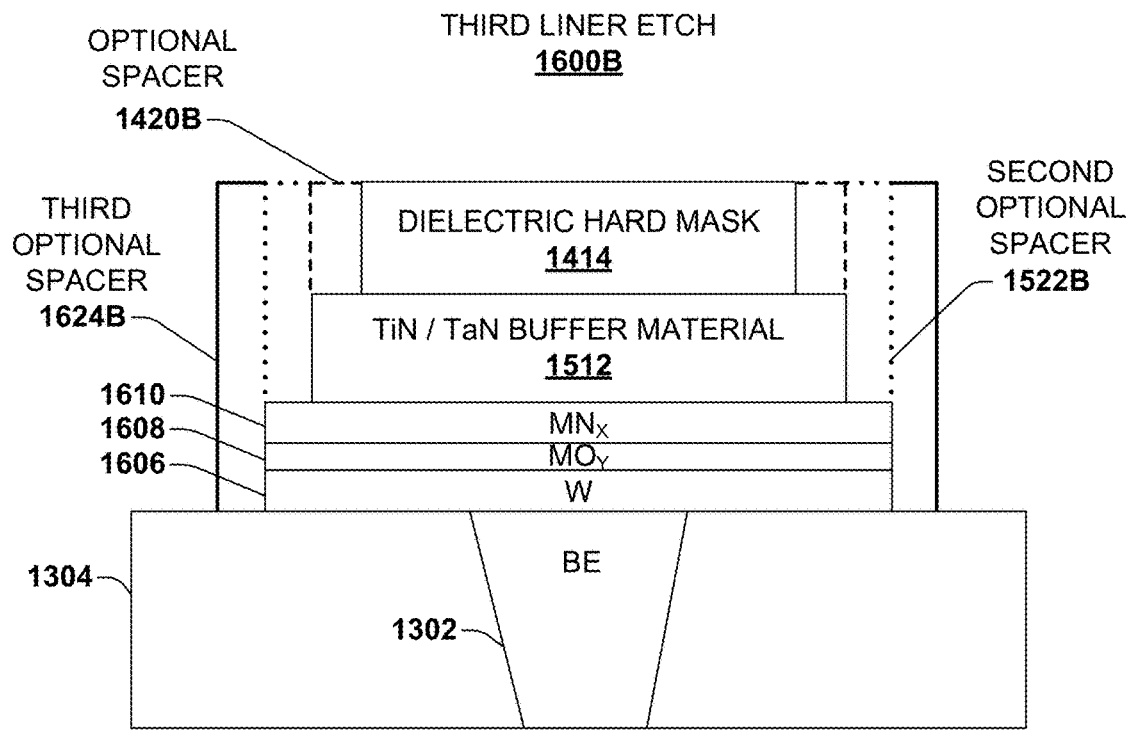

FIGS. 16A and 16B depict an optional third liner deposition 1600A and third liner etch 1600B according to still further embodiments, respectively. Optional third liner deposition 1600A provides an optional third liner layer 1624A overlying a top surface of dielectric layer 1304, sides of etched W layer 1606, etched MOy layer 1608, etched MNx layer 1610 and second optional spacer 1522B or optional spacer 1420B (or etched TiN/TaN buffer material 1512, or etched dielectric hard mask 1414 depending on which of the optional spacers are present, if any). Optional third liner layer 1624A can be formed of one or more materials selected from a group consisting of: SiN, SiO, SiON, SiC, and SiOC. An optional third liner etch 1600B can remove optional third liner layer 1624A from a top surface of etched dielectric hard mask 1414 and at least a portion of dielectric layer 1304, and forms a third optional spacer 1624B, in one or more embodiments.

Figure 17:
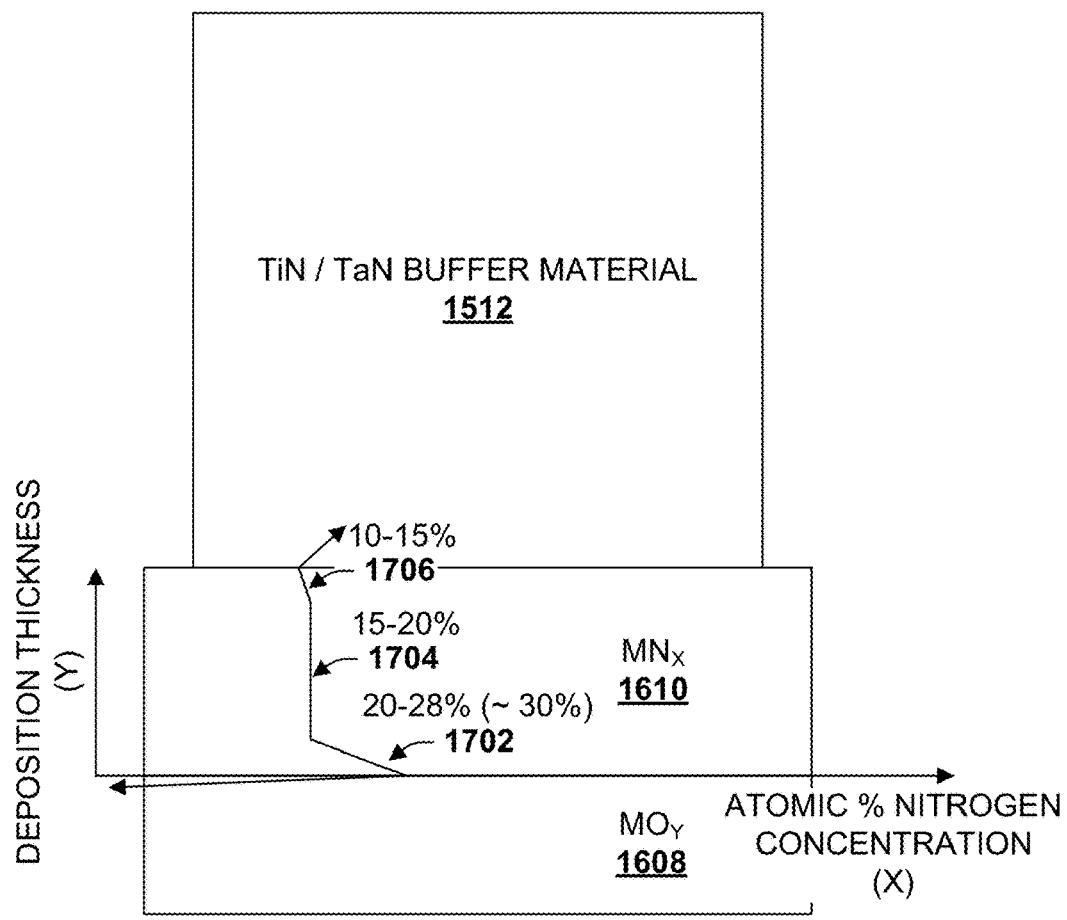
FIG. 17 illustrates an example nitrogen concentration profile for a metal nitrogen layer of a non-volatile resistive switching device, according to other embodiments.

FIG. 17 illustrates an example nitrogen concentration profile 1700 for a metal-nitrogen layer of a resistive switching memory device, according to additional embodiments of the present disclosure. Nitrogen concentration profile 1700 depicts etched MOy layer 1608 underlying etched MNx layer 1610 and etched TiN/TaN buffer material 1512 following third etch: switching matrix and bottom plate 1600. Nitrogen concentration profile 1700 is illustrated for metal nitrogen of the etched MNx layer 1610 (and nearby portions of etched MOy layer 1608 and etched TiN/TaN buffer material 1512), showing atomic % nitrogen concentration along the (X) axis and deposition thickness of metal nitrogen material along the (Y) axis. Nitrogen concentration profile 1700 can have an increased nitrogen portion 1702 having nitrogen atomic percentage in a range of about 20 to about 28% (up to about 30% in some embodiments) at a boundary of the etched MNx layer 1610 and etched MOy layer 1608. Additionally, a moderate nitrogen portion 1704 having nitrogen atomic percentage in a range of about 15 to about 20%, and a decreased nitrogen portion 1706 having nitrogen atomic percentage in a range of about 10 to about 15% at a boundary of etched MNx layer 1610 and etched TiN/TaN buffer material 1512.

Figure 18:
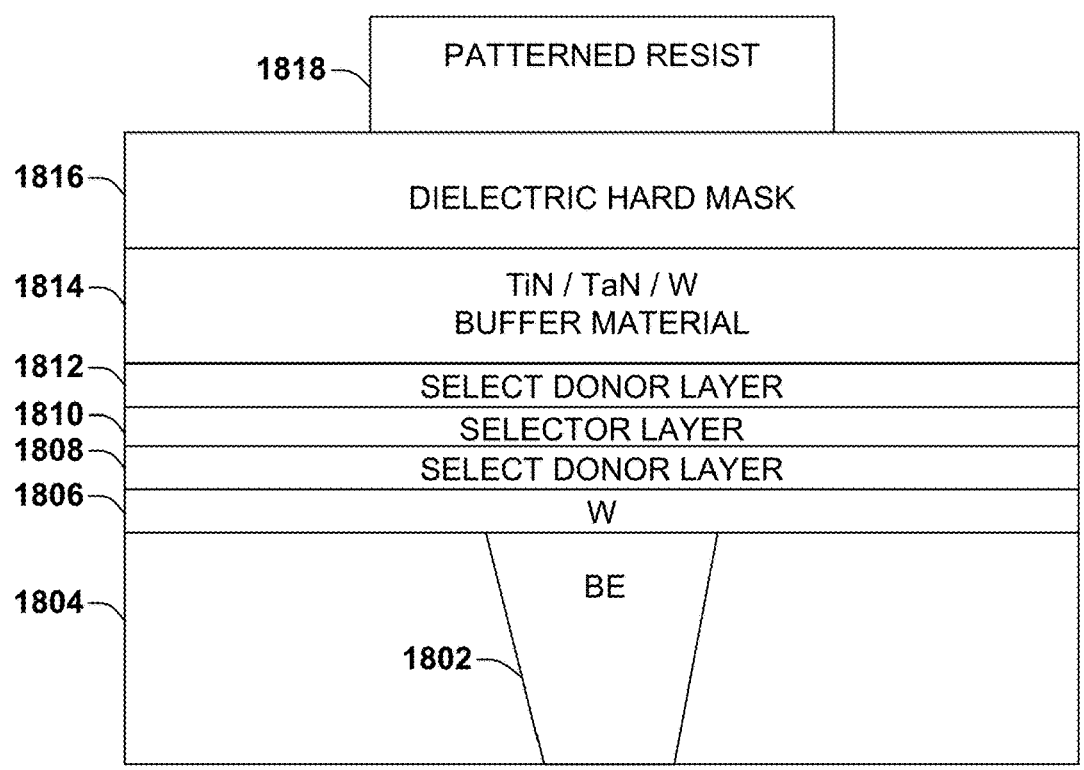
FIG. 18 illustrates a sample deposition of a resistive switching memory according to still further embodiments of the present disclosure.

FIG. 18 depicts a block diagram of an example selector device deposition 1800 according to alternative or additional embodiments of the present disclosure. Selector device deposition 1800 can be utilized to form a volatile resistive switching selector device, in various embodiments. Selector device deposition 1800 can include a bottom electrode (BE) 1802 formed in a gap or void in a dielectric layer 1804. The gap/void can be formed as part of a damascene process, in an embodiment(s). A tungsten (W) layer 1806 is formed over the dielectric layer 1804 and BE 1802. Overlying the W layer 1806 is a selector stack including a select donor layer 1812 overlying a selector layer 1810 overlying another select donor layer 1808, which overlies W layer 1806. In one or more embodiments, select donor layer 1812 or select donor layer 1808 can be formed of a metal material that can be ionized in response to a physical stimulus (e.g., a current, a voltage, an electric field, a magnetic field, a temperature, or the like or a suitable combination of the foregoing). In an embodiment, the metal material can be doped with a second material, such as a second metal.

Examples of suitable materials for the select donor layer 1812 or select donor layer 1808 can include a noble metal (e.g., Ag, Pd, Pt, Au, etc.), a metal alloy or a metal mixture containing noble metal in part or a noble metal doped with another metal (e.g., Ag—Al, Ag—Pt, Ag—Pd, Ag—Pd—Cu, Ag—W, Ag—Ti, Ag—TiN, Ag—TaN, and so forth, as described above or elsewhere herein). A noble metal or alloy thereof can be utilized to facilitate mitigated interaction between the select donor layer 1812 or the select donor layer 1808 and selector layer 1810, situated between select donor layer 1812 and select donor layer 1808 for instance. This mitigated particle interaction (e.g., that mitigates or avoids chemical bonding of the select donor layer 1808 particles or the select donor layer 1812 particles with particles of the selector layer 1810) can facilitate improved longevity and reliability for a selector device formed from selector device deposition 1800, as one example. Another example of a suitable material for select donor layer 1812 or select donor layer 1808 can include a material with relatively fast diffusing particles. Faster diffusion can include, for instance, a capacity to move among defect sites (e.g., voids or gaps in molecular material) within a solid, e.g., defined by a suitable surface energy, facilitating dispersion of the relatively fast diffusion particles absent a suitable aggregating force, for instance (e.g., an external voltage of greater than a threshold magnitude, and so forth). Materials with relatively fast diffusing particles can facilitate fast state switching of the selector device (e.g., from a non-conductive state to a conductive state), at lower bias values than materials with slower diffusing particles. Examples of suitable fast diffusing materials can include Ag, Cu, Au, Co, Ni, Al, Fe, or the like, suitable alloys or mixtures thereof, such metals doped with one or more other metals (e.g., Ag doped with 1%-5% Cu, Au, Al, Pd or Pt; Cu doped with 1%-5% Ag, Ni, Al, Pd, Pt, Au doped with 1%-5% Ag, Cu, Al, Pd or Pt, and so forth), or suitable combinations of the foregoing. In one example embodiment, the metal material can be silver metal doped with 1%-5% (e.g., about 2%) platinum or palladium metal.

In various embodiments, selector layer 1810 can be an electrical insulator or ionic conductor. Further, the selector layer 1810 can be a material (e.g., an oxide, a sub-oxide, etc.) at least weakly permeable to particles of the select donor layer 1812 or select donor layer 1808. In some embodiments, the selector layer 1810 can be a non-stoichiometric material. In such embodiments, suitable materials for selector layer 1810 can include, e.g., non-stoichiometric materials of: $SiO_x$, $TiO_x$, $AlO_x$, $WO_x$, $Ti_xN_y$, $O_z$, $HfO_x$, $TaO_x$, $NbO_x$, or the like, or suitable combinations thereof, where x, y and z can be suitable non-stoichiometric values. As a particular non-limiting example, the selector layer can be $SiO_x$ where x is between about 0.1 and about 2. In some embodiments, the selector layer can be a (doped or undoped) chalcogenide or a solid-electrolyte material containing one or more of Ge, Sb, S, Te. In yet another embodiment, the selector material can comprise a stack of a plurality of the above-mentioned materials (e.g., $SiO_x$/GeTe, TiOx/AlOx, and so forth). In at least one embodiment of the present disclosure, the selector layer 1810 can be doped with a metal(s) during fabrication, to facilitate metal ion injection from the select donor layer 1812 or select donor layer 1808.

Overlying the select donor layer 1812 is a buffer material 1814. Buffer material 1814 can comprise TiN, TaN or W material, or the like, or a suitable combination of the foregoing. Overlying buffer material 1814 is a dielectric hard mask 1816. A patterned resist 1818 is provided over dielectric hard mask 1816.

Figure 19:
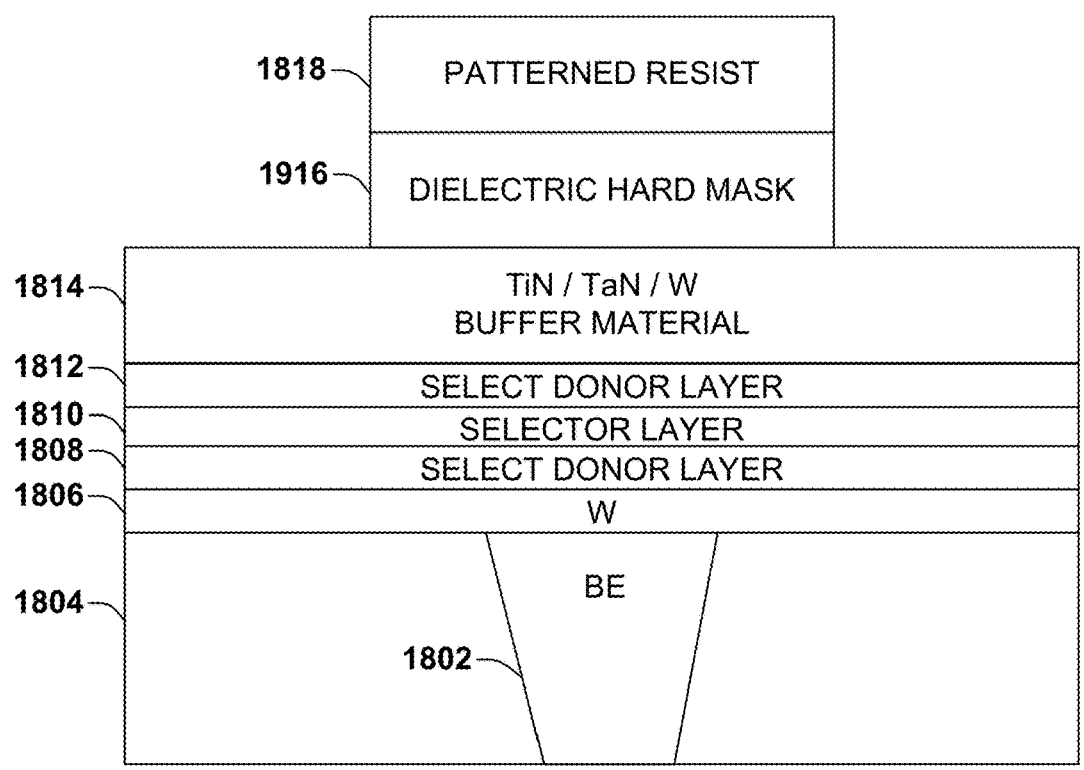
FIGS. 19-21 depict an example process for fabricating discrete volatile resistive switching devices according to still further embodiments disclosed herein.

FIG. 19 illustrates a block diagram of a first etch: hard mask plasma etch 1900 for the resistive memory deposition 1800 of FIG. 18, supra. The first etch utilizes patterned resist 1818 as a mask to etch dielectric hard mask 1816 and form etched dielectric hard mask 1916. First etch: hard mask plasma etch 1900 can be a plasma etch utilizing a gas selected from a group consisting of: $C_4F_8$, $C_4F_6$, $CHF_3$, $CF_4$, CO, $O_2$, $N_2$ and Ar. The first etch: hard mask plasma etch 1900 is stopped when buffer material 1814 is reached, resulting in resistive memory deposition 1900 substantially as depicted by FIG. 19.

Figure 20:
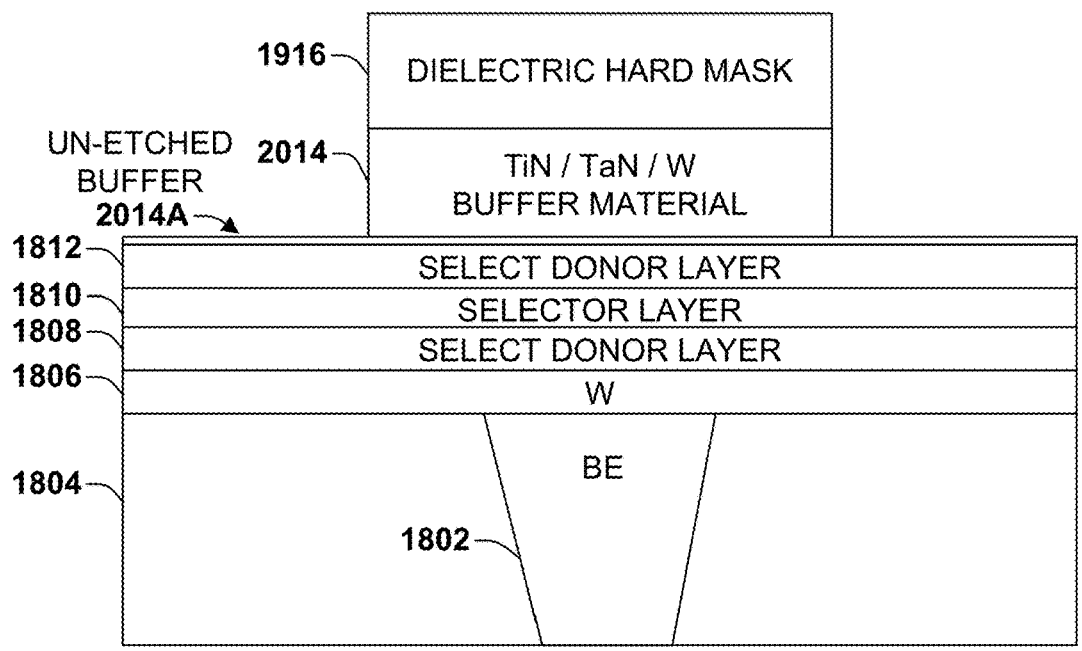

FIG. 20 illustrates a photoresist strip+clean; second etch: buffer 2000 that is performed to remove patterned resist 1818 (e.g., an $O_2$ ash, an $O_2$/$CF_4$ ash, or the like, or a suitable combination of the foregoing). An optional clean can be implemented following the photoresist strip (e.g., a dimethyl sulfoxide (DMSO) rinse, an EKC rinse, a hydrogen fluoride (HF) clean, a deionized (DI) water rinse or the like, or a suitable combination of the foregoing). The second etch will remove most of buffer material 1814 to form etched buffer material 2014, leaving a small thin layer of un-etched buffer 2014A. The second etch can be a plasma etch utilizing a gas selected from a group consisting of: $Cl_2$, $BCl_3$, HBr, Ar, $N_2$, He, $O_2$, $CHF_3$, $CF_4$, and $SF_6$. In a particular embodiment, second etch utilizes a halogen etch, such as $Cl_2$, $BCl_3$ or HBr. A post etch clean utilizing $O_2$ ash, a dilute HF, an ultra-dilute HF, an EKC clean, sulfuric peroxide mixture (SPM) rinse, a $H_2O_2$ rinse, a tetramethylammonium hydroxide (TMAH) rinse, a DI water rinse, or the like, or a suitable combination of the foregoing can be utilized following the second etch.

Figure 21:
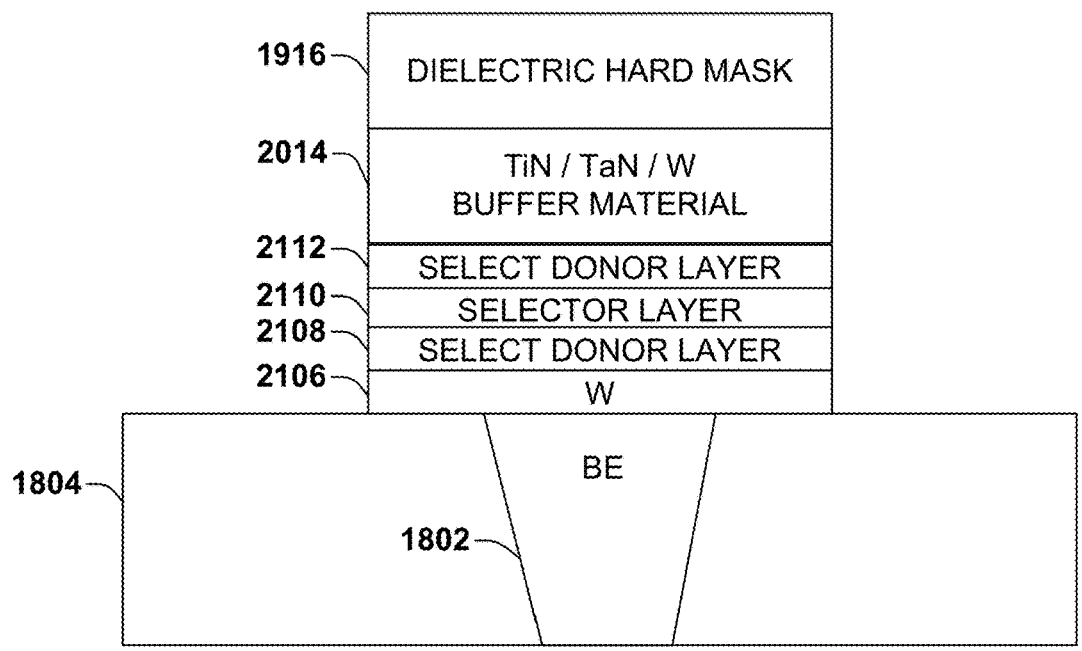

FIG. 21 depicts a block diagram of an example third etch: physical etch 2100. The physical etch initially removes un-etched buffer 2014A. Third etch: physical etch 2100 can also etch select donor layer 1812, selector layer 1810 and select donor layer 1808. In various embodiments, third etch: physical etch 2100 can remove W layer 1806 as well. Following third etch: physical etch 2100, etched select donor layer 2112, etched selector layer 2110, etched select donor layer 2108 and etched W layer 2106 are formed overlying BE 1802 and dielectric layer 1804.

Third etch: physical etch 2100 can be an ion mill etch (e.g., a focused ion beam (FIB)), in an embodiment. In further embodiments, third etch: physical etch 2100 can be an argon plasma etch. Following third etch: physical etch 2100 one or more optional cleaning processes can be implemented to remove extraneous material from sidewalls of etched dielectric hard mask 1916, etched buffer material 2014, etched select donor layer 2112, etched selector layer 2110, etched select donor layer 2108 or etched W layer 2106. In an embodiment, no clean may be implemented after third etch: physical etch 2100.

Figure 22:
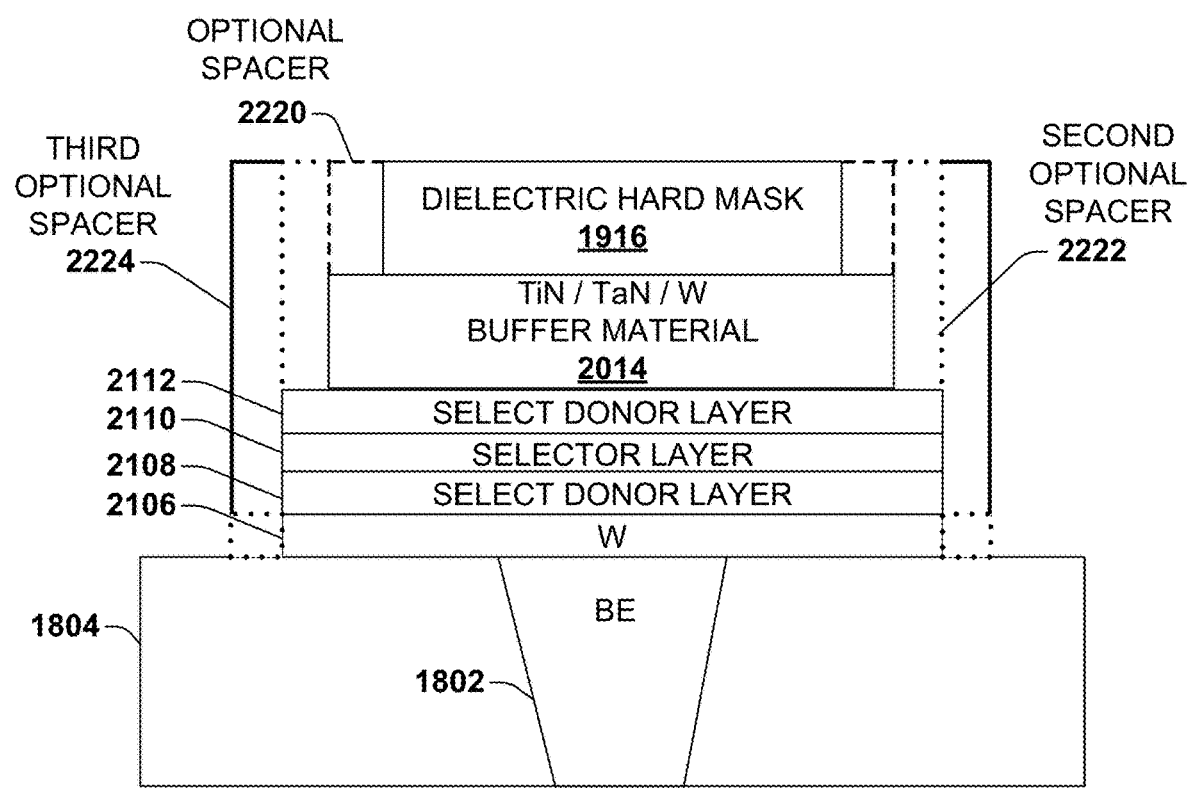
FIG. 22 illustrates example optional spacer profiles for a discrete volatile resistive switching device of FIG. 21, in an embodiment(s)

In an embodiment, referring to FIG. 22 the third etch: physical etch 2100 can be implemented in parts between optional spacer deposition(s) and etch(es), as an example. As an illustrative example, an optional spacer 2220 can be formed about an edge of etched dielectric hard mask 1916. Likewise, a second optional spacer 2222 can be formed about an edge of etched buffer material 2014. In such case, second optional spacer 2222 can be implemented following the second etch, or following a portion of the physical etch 2100 that removes un-etched buffer 2014A. In the latter embodiment, physical etch 2100 can first remove un-etched buffer 2014A and then third optional spacer 2224 can be formed adjacent to etched buffer material 2014. In further embodiments, the physical etch 2100 can subsequently remove one or more of the: select donor layer 2112, selector layer 2110, select donor layer 2108 and W layer 2106 and an optional spacer can be formed adjacent to etched layers. For instance, in the embodiment illustrated by FIG. 22, the physical etch 2100 etches etched select donor layer 2112, etched selector layer 2110 and etched select donor layer 2108 and then third optional spacer 2224 is formed. The physical etch 2100 can be completed by subsequently etching W layer to form etched W layer 2106. However, in other embodiments, etched W layer 2106 can be formed with the physical etch of etched select donor layer 2112, etched selector layer 2110 and etched select donor layer 2108 and third optional spacer 2224 can be formed adjacent to etched W layer 2106 as well.

The diagrams included herein are described with respect to various components of a memory device, or memory architectures comprising one or more memory devices or integrated circuit devices. It should be appreciated that such diagrams can include those components, layers and depositions specified therein, some of the specified components/layers/depositions, or additional components/layers/depositions. Sub-layers can also be implemented as adjacent other sub-layers within a depicted layer. Additionally, it is noted that one or more disclosed processes can be combined into a single process providing aggregate functionality. For instance, a deposition process can comprise an etching process, or vice versa, to facilitate depositing and etching a component of a resistive switching device by way of a single process. Components of the disclosed architectures can also interact with one or more other components not specifically described herein but known by those of skill in the art.

In view of the exemplary diagrams described supra, process methods that can be implemented in accordance with the disclosed subject matter can be implemented according to the illustrations of FIGS. 1-22. While for purposes of simplicity of explanation, the methods are shown and described as a series of block diagrams, it is to be understood and appreciated that the claimed subject matter is not limited by the order of the diagrams, as some steps in disclosed processes may occur in different orders and/or concurrently with other steps from what is depicted and described herein. Moreover, not all illustrated steps may be required to implement the methods described herein, and in some embodiments additional steps known in the art or reasonably conveyed to one of ordinary skill in the art by way of the context provided herein are also considered within the scope of the present disclosure. Moreover, some steps illustrated as part of one process can be implemented for another process where suitable (e.g., optional liner deposition(s) and optional liner etch(es) illustrated in FIGS. 14A/B, 15A/B and 16A/B can be implemented for other processes disclosed in the present specification; other steps of one or more processes can be added or substituted in other processes disclosed herein within the scope of the present disclosure). Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Example Operating Environments

Figure 23:
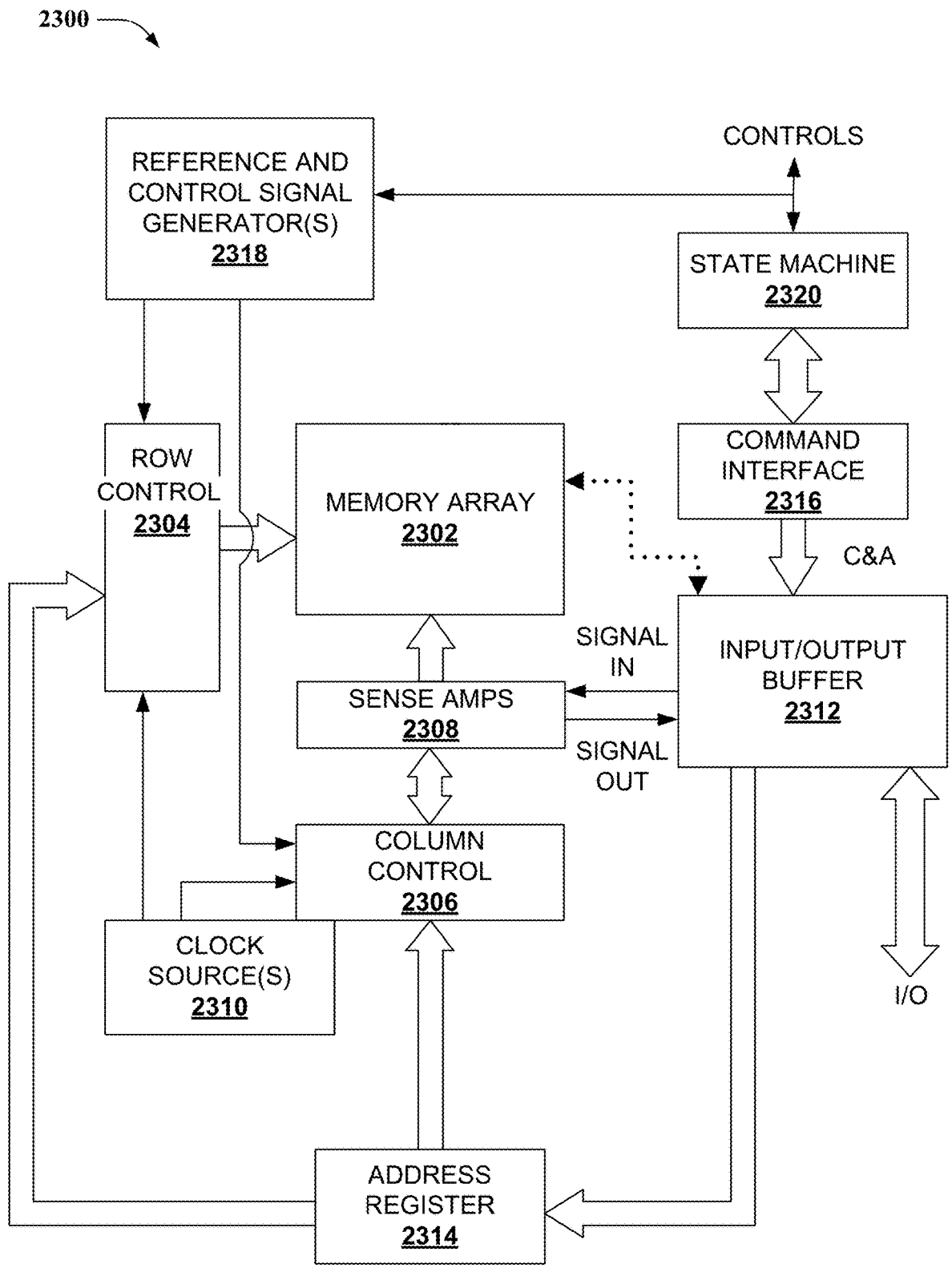
FIG. 23 illustrates a block diagram of an example electronic operating environment in accordance with embodiments of the present disclosure.

FIG. 23 illustrates a block diagram of an example operating and control environment 2300 for a memory array 2302 of a memory cell array according to aspects of the subject disclosure. Control environment 2300 and memory array 2302 can be formed within a single semiconductor die in some embodiments, although the subject disclosure is not so limited and in other embodiments some components of control environment can be formed on a separate semiconductor die. In at least one aspect of the subject disclosure, memory array 2302 can comprise memory selected from a variety of memory cell technologies. In at least one embodiment, memory array 2302 can comprise a two-terminal memory technology, arranged in a compact two or three-dimensional architecture. Suitable two-terminal memory technologies can include resistive-switching memory, conductive-bridging memory, phase-change memory, organic memory, magneto-resistive memory, or the like, or a suitable combination of the foregoing. In a further embodiment, the two-terminal memory technology can be a resistive memory technology formed by a process disclosed herein.

A column controller 2306 and sense amps 2308 can be formed adjacent to memory array 2302. Moreover, column controller 2306 can be configured to activate (or identify for activation) a subset of bit lines of memory array 2302. Column controller 2306 can utilize a control signal provided by a reference and control signal generator(s) 2318 to activate, as well as operate upon, respective ones of the subset of bitlines, applying suitable program, erase or read voltages to those bitlines. Non-activated bitlines can be kept at an inhibit voltage (also applied by reference and control signal generator(s) 2318), to mitigate or avoid bit-disturb effects on these non-activated bitlines.

In addition, operating and control environment 2300 can comprise a row controller 2304. Row controller 2304 can be formed adjacent to and electrically connected with word lines of memory array 2302. Also utilizing control signals of reference and control signal generator(s) 2318, row controller 2304 can select particular rows of memory cells with a suitable selection voltage. Moreover, row controller 2304 can facilitate program, erase or read operations by applying suitable voltages at selected word lines.

Sense amps 2308 can read data from, or write data to, the activated memory cells of memory array 2302, which are selected by column control 2306 and row control 2304. Data read out from memory array 2302 can be provided to an input/output buffer 2312. Likewise, data to be written to memory array 2302 can be received from the input/output buffer 2312 and written to the activated memory cells of memory array 2302.

A clock source(s) 2310 can provide respective clock pulses to facilitate timing for read, write, and program operations of row controller 2304 and column controller 2306. Clock source(s) 2310 can further facilitate selection of word lines or bit lines in response to external or internal commands received by operating and control environment 2300. Input/output buffer 2312 can comprise a command and address input, as well as a bidirectional data input and output. Instructions are provided over the command and address input, and the data to be written to memory array 2302 as well as data read from memory array 2302 is conveyed on the bidirectional data input and output, facilitating connection to an external host apparatus, such as a computer or other processing device (not depicted, but see e.g., computer 2402 of FIG. 24, infra).

Input/output buffer 2312 can be configured to receive write data, receive an erase instruction, receive a status or maintenance instruction, output readout data, output status information, and receive address data and command data, as well as address data for respective instructions. Address data can be transferred to row controller 2304 and column controller 2306 by an address register 2314. In addition, input data is transmitted to memory array 2302 via signal input lines between sense amps 2308 and input/output buffer 2312, and output data is received from memory array 2302 via signal output lines from sense amps 2308 to input/output buffer 2312. Input data can be received from the host apparatus, and output data can be delivered to the host apparatus via the I/O bus.

Commands received from the host apparatus can be provided to a command interface 2316. Command interface 2316 can be configured to receive external control signals from the host apparatus, and determine whether data input to the input/output buffer 2312 is write data, a command, or an address. Input commands can be transferred to a state machine 2320.

State machine 2320 can be configured to manage programming and reprogramming of memory array 2302 (as well as other memory banks of a multi-bank memory array). Instructions provided to state machine 2320 are implemented according to control logic configurations, enabling state machine 2320 to manage read, write, erase, data input, data output, and other functionality associated with memory cell array 2302. In some aspects, state machine 2320 can send and receive acknowledgments and negative acknowledgments regarding successful receipt or execution of various commands. In further embodiments, state machine 2320 can decode and implement status-related commands, decode and implement configuration commands, and so on.

To implement read, write, erase, input, output, etc., functionality, state machine 2320 can control clock source(s) 2310 or reference and control signal generator(s) 2318. Control of clock source(s) 2310 can cause output pulses configured to facilitate row controller 2304 and column controller 2306 implementing the particular functionality. Output pulses can be transferred to selected bit lines by column controller 2306, for instance, or word lines by row controller 2304, for instance.

In connection with FIG. 24, the systems, devices, and/or processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 24:
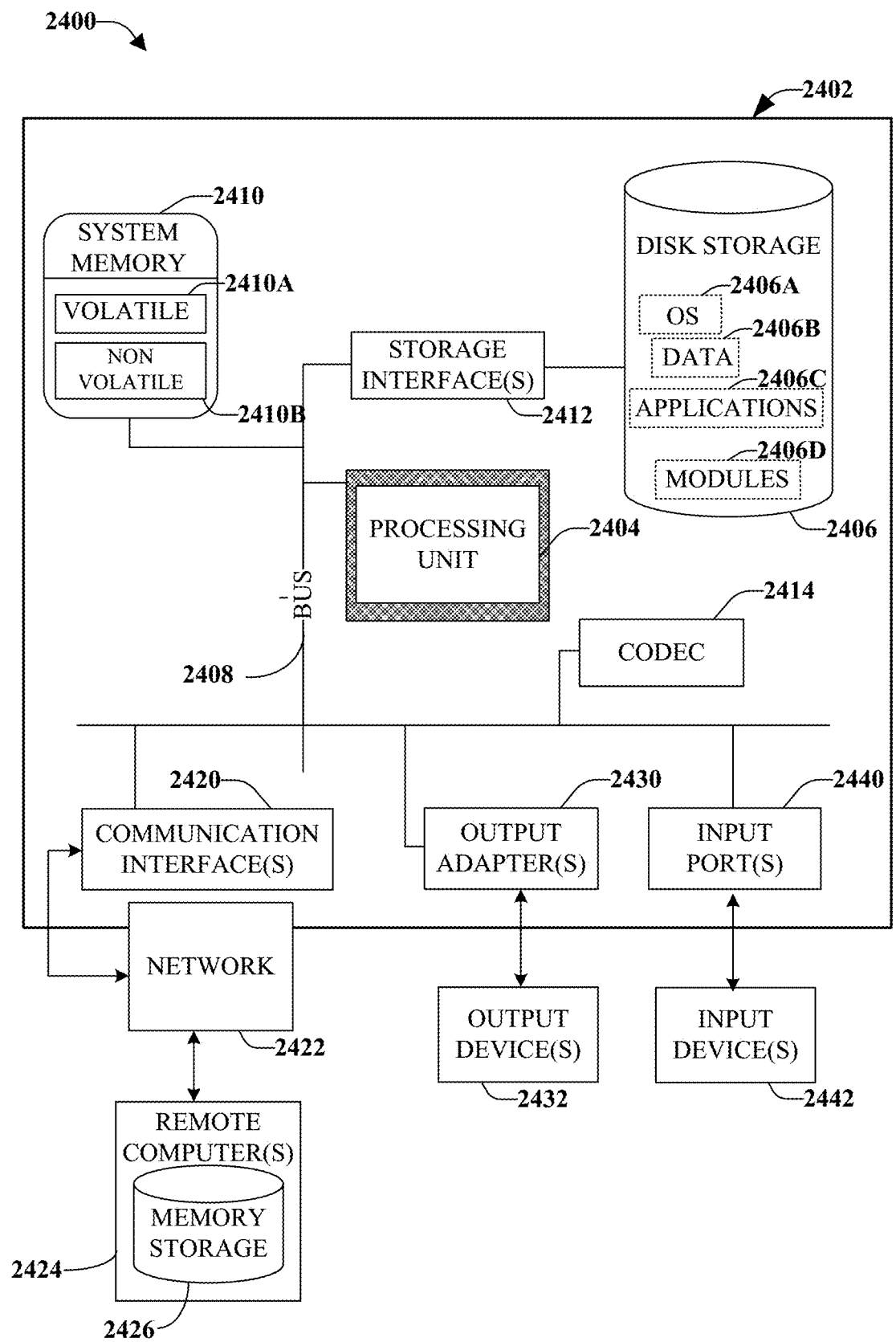
FIG. 24 depicts a block diagram of an example computing environment for implementing one or more disclosed embodiments presented herein.

With reference to FIG. 24, a suitable environment 2400 for implementing various aspects of the claimed subject matter includes a computer 2402. The computer 2402 includes a processing unit 2404, a system memory 2410, a codec 2414, and a system bus 2408. The system bus 2408 couples system components including, but not limited to, the system memory 2410 to the processing unit 2404. The processing unit 2404 can be any of various available processors. Dual microprocessors and other multiprocessor architectures also can be employed as the processing unit 2404.

The system bus 2408 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 2410 includes volatile memory 2410A and non-volatile memory 2410B. The basic input/output system (BIOS), containing the basic routines to transfer information between elements within the computer 2402, such as during start-up, is stored in non-volatile memory 2410B. In addition, according to present innovations, codec 2414 may include at least one of an encoder or decoder, wherein the at least one of an encoder or decoder may consist of hardware, software, or a combination of hardware and software. Although, codec 2414 is depicted as a separate component, codec 2414 may be contained within non-volatile memory 2410B. By way of illustration, and not limitation, non-volatile memory 2410B can include read only memory (ROM), programmable ROM (PROM), electrically programmable ROM (EPROM), electrically erasable programmable ROM (EEPROM), or flash memory, two-terminal memory, and so on. Volatile memory 2410A includes random access memory (RAM), and in some embodiments can embody a cache memory. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM).

Computer 2402 may also include removable/non-removable, volatile/non-volatile computer storage medium. FIG. 24 illustrates, for example, disk storage 2406. Disk storage 2406 includes, but is not limited to, devices like a magnetic disk drive, solid state disk (SSD) floppy disk drive, tape drive, Jaz drive, Zip drive, LS-100 drive, flash memory card, or memory stick. In addition, disk storage 2406 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 2406 to the system bus 2408, a removable or non-removable interface is typically used, such as storage interface 2412. It is appreciated that storage devices 2406 can store information related to a user. Such information might be stored at or provided to a server or to an application running on a user device. In one embodiment, the user can be notified (e.g., by way of output device(s) 2432) of the types of information that are stored to disk storage 2406 or transmitted to the server or application. The user can be provided the opportunity to opt-in or opt-out of having such information collected and/or shared with the server or application (e.g., by way of input from input device(s) 2442).

It is to be appreciated that FIG. 24 describes software that acts as an intermediary between users and the basic computer resources described in the suitable operating environment 2400. Such software includes an operating system 2406A. Operating system 2406A, which can be stored on disk storage 2406, acts to control and allocate resources of the computer system 2402. Applications 2406C take advantage of the management of resources by operating system 2406A through program modules 2406D, and program data 2406D, such as the boot/shutdown transaction table and the like, stored either in system memory 2410 or on disk storage 2406. It is to be appreciated that the claimed subject matter can be implemented with various operating systems or combinations of operating systems.

A user enters commands or information into the computer 2402 through input device(s) 2442. Input devices 2442 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 2404 through the system bus 2408 via input port(s) 2440. Input port(s) 2440 include, for example, a serial port, a parallel port, a game port, and a universal serial bus (USB). Output device(s) 2432 use some of the same type of ports as input device(s) 2442. Thus, for example, a USB port may be used to provide input to computer 2402 and to output information from computer 2402 to an output device 2432. Output adapter 2430 is provided to illustrate that there are some output devices 2432 like monitors, speakers, and printers, among other output devices 2432, which require special adapters. The output adapters 2430 include, by way of illustration and not limitation, video and sound cards that provide a means of connection between the output device 2432 and the system bus 2408. It should be noted that other devices and/or systems of devices provide both input and output capabilities such as remote computer(s) 2438.

Computer 2402 can operate in a networked environment using logical connections to one or more remote computers, such as remote computer(s) 2424. The remote computer(s) 2424 can be a personal computer, a server, a router, a network PC, a workstation, a microprocessor based appliance, a peer device, a smart phone, a tablet, or other network node, and typically includes many of the elements described relative to computer 2402. For purposes of brevity, only a memory storage device 2426 is illustrated with remote computer(s) 2424. Remote computer(s) 2424 is logically connected to computer 2402 through a network 2422 and then connected via communication interface(s) 2420. Network 2422 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication interface(s) 2420 refers to the hardware/software employed to connect the network 2422 to the bus 2408. While communication interface(s) 2420 is shown for illustrative clarity inside computer 2402, it can also be external to computer 2402. The hardware/software necessary for connection to the network 2422 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments include a system as well as a computer-readable medium having computer-executable instructions for performing the acts and/or events of the various processes.

In addition, while a particular feature may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising".

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Further embodiments can be envisioned to one of ordinary skill in the art after reading this disclosure. For example, in various embodiments, erase operations may be initiated upon a plurality of ReRAM devices (e.g. 16, 32, etc.) at the same time.

In other embodiments, combinations or sub-combinations of the above disclosed embodiments can be advantageously made. The block diagrams of the architecture and flow charts are grouped for ease of understanding. However, it should be understood that combinations of blocks, additions of new blocks, re-arrangement of blocks, and the like are contemplated in alternative embodiments of the present disclosure.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating a two-terminal resistive switching memory device, comprising:
   depositing a metal layer overlying and in contact with a bottom electrode and with a dielectric material, wherein the bottom electrode is formed within a void fabricated in the dielectric material, wherein the void is fabricated with a damascene process, and wherein the bottom electrode and the dielectric material overlie a substrate;
   depositing a switching matrix overlying the metal layer, the switching matrix formed of an electrically resistive material having material defect sites configured to trap conductive particles;
   depositing a donor material layer overlying the switching matrix comprising metal material including aluminum (Al), titanium (Ti) or tungsten (W) metal material, the donor material layer selected to provide conductive particles to the switching matrix in response to an electrical stimulus, the conductive particles including Al, Ti, or W metal particles;
   optionally depositing an optional barrier material layer overlying the donor material layer;
   depositing an electrically conductive first barrier material overlying the optional barrier material layer or the donor material layer;
   depositing a dielectric hard mask overlying the electrically conductive first barrier material;
   patterning a photoresist material overlying the dielectric hard mask;
   etching the dielectric hard mask with a first etch and stopping the first etch on the electrically conductive first barrier material, the first etch comprising a plasma etch consisting of an etching gas selected from a first group consisting of: octafluorocyclobutane ($C_4F_8$), hexafluoro-2-butyne ($C_4F_6$), fluoroform ($CHF_3$), carbon tetrafluoride ($CF_4$), carbon monoxide (CO), oxygen ($O_2$), dinitrogen ($N_2$) and argon (Ar); and
   etching the electrically conductive first barrier material, the optional barrier material layer, the donor material layer, the switching matrix and the metal layer with a second etch and stopping the second etch on the dielectric material, the second etch comprising a plasma etch consisting of an etching gas selected from a second group consisting of: chlorine ($Cl_2$), boron trichloride ($BCl_3$), hydrogen bromide (HBr), Ar, $N_2$, helium (He), $O_2$, $CHF_3$, $CF_4$, and sulfur hexafluoride ($SF_6$).

2. The method of claim 1, further comprising, following the first etch:
   stripping the photoresist utilizing an $O_2$ ash or an $O_2/CF_4$ ash; and
   cleaning the etched dielectric hard mask utilizing EKC, dimethyl sulfoxide (DMSO), hydrogen fluoride (HF) or deionized (DI) water rinse.

3. The method of claim 1, further comprising, following the second etch:
   cleaning surfaces of the two-terminal resistive switching memory device exposed by the second etch with an oxygen ash; and
   cleaning the surfaces of the two-terminal resistive switching memory device with at least one of: a dilute HF, an ultra-dilute HF, EKC, a sulfuric peroxide mixture (SPM), hydrogen peroxide ($H_2O_2$), tetramethylammonium hydroxide (TMAH) or a DI water rinse.

4. The method of claim 1, further comprising depositing a liner material overlying a top surface of the dielectric material and surfaces of the dielectric hard mask, electrically conductive first barrier material, optional barrier material layer, donor material layer, switching matrix and the metal layer exposed by the first etch or the second etch, wherein the liner material comprises a SiN, SiON, SiC, or $AlO_x$.

5. The method of claim 1, further comprising depositing the metal layer with a W or a TiN material with a thickness in a range of 50 angstrom (A) to 500 A.

6. The method of claim 1, further comprising depositing the switching matrix with a material selected from a third group consisting of: $SiO_x$, amorphous Si, Si, $TiO_x$, $AlO_x$, $HfO_x$, $NiO_x$, $TaO_x$, $NbO_x$, $ZnO_2$, $ZrO_x$ and $GdO_x$, wherein the switching matrix has a thickness in a range from about 10 A to about 40 A.

7. The method of claim 1, wherein the metal material of the donor material layer is selected from a third group consisting of: elemental Al, elemental Ti, elemental W, a non-stoichiometric AlNx, a non-stoichiometric AlNOx, and a non-stoichiometric TiN, and wherein the donor material layer has a thickness within a range from about 50 A to about 500 A.

8. The method of claim 7, wherein the electrically conductive first barrier material is in physical contact with the donor material layer and the electrically conductive first barrier material is comprised of TiN or TaN, and wherein the electrically conductive first barrier material has a second thickness within a second range from about 200 A to about 1500 A.

9. The method of claim 1, wherein the optional barrier material layer is comprised of Ti or W and has a thickness in a range from about 50 A to about 500 A.

10. The method of claim 1, wherein the dielectric hard mask is comprised of a $SiO_2$ material, a SiN material, a SiC material, a SiON material or an amorphous carbon.

11. A method for fabricating a two-terminal resistive switching device, comprising:
    depositing a metal layer overlying and in contact with a bottom electrode and with a dielectric material, and wherein the bottom electrode and the dielectric material overlie a substrate;
    depositing an electrically conductive select donor layer overlying the metal layer;
    depositing a selector layer formed of an electrically resistive material having material defect sites configured to permit diffusion of conductive particles of the select donor layer within the selector layer in response to a first polarity bias applied to the two-terminal resistive switching device;
    depositing a second electrically conductive select donor layer overlying the selector layer that supplies second conductive particles to the selector layer in response to a second polarity bias applied to the two-terminal resistive switching device;

depositing an electrically conductive buffer material overlying the second electrically conductive select donor layer;

depositing a dielectric hard mask overlying the electrically conductive buffer material;

patterning a photoresist material overlying the dielectric hard mask;

etching the dielectric hard mask with a first etch and stopping the first etch on the electrically conductive buffer material, the first etch comprising an etching gas including at least one of: $C_4F_8$, $C_4F_6$, $CHF_3$, $CF_4$, CO, $O_2$, $N_2$ or Ar;

etching with a second etch a majority of the electrically conductive buffer material with a second etch and stopping the second etch without exposing the second electrically conductive select donor layer by the second etch, the second etch comprising an etching gas including one or more of: $Cl_2$, $BCl_3$, HBr, Ar, $N_2$, He, $O_2$, $CHF_3$, $CF_4$, and $SF_6$; and etching with a third etch comprising a physical etch a remaining minority of the electrically conductive buffer material, the second electrically conductive select donor layer, the selector layer and the electrically conductive select donor layer.

12. The method of claim 11, wherein the physical etch further comprises etching the metal layer and stopping the physical etch on the dielectric material.

13. The method of claim 11, wherein the physical etch is an argon plasma etch or an ion mill etch.

14. The method of claim 11, further comprising forming a liner layer overlying an etched stack comprising at least: the electrically conductive select donor layer, the selector layer, the second electrically conductive select donor layer, and the electrically conductive buffer material.

15. The method of claim 11, wherein the third etch further comprises etching the metal layer and stopping the third etch on the dielectric material.

16. The method of claim 11, wherein depositing the electrically conductive select donor layer or the second electrically conductive select donor layer further comprises depositing a doped silver material for the electrically conductive selector donor layer or the second electrically conductive select donor layer, respectively.

17. The method of claim 16, wherein the doped silver material is doped with a platinum dopant or a palladium dopant.

18. The method of claim 16, wherein depositing the selector layer further comprises depositing a non-stoichiometric material selected from a group consisting of: $SiO_x$, $TiO_x$, $AlO_x$, $WO_x$, $Ti_xN_yO_z$, $HfO_x$, $TaO_x$, a stack of $SiO_x$ and GeTe, and a stack of $TiO_x$ and $AlO_x$.

19. The method of claim 11, wherein the electrically conductive select donor layer and the second electrically conductive select donor layer comprise a platinum doped silver material.

20. The method of claim 11, further comprising forming one or more optional spacers adjacent at least one of:
the etched dielectric hard mask,
the etched majority of the electrically conductive buffer material, or
the etched electrically conductive select donor layer, etched selector layer and etched second electrically conductive select donor layer.

* * * * *